United States Patent
Fremrot et al.

(10) Patent No.: US 12,471,240 B2
(45) Date of Patent: Nov. 11, 2025

(54) TEMPERATURE-BASED HEAT SINK AIRFLOW CHANNEL ADJUSTMENT SYSTEM

(71) Applicant: Dell Products L.P., Round Rock, TX (US)

(72) Inventors: Per Henrik Fremrot, Novato, CA (US); Colin Montgomery, Mountain View, CA (US); Maunish Shah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 74 days.

(21) Appl. No.: 18/486,348

(22) Filed: Oct. 13, 2023

(65) Prior Publication Data

US 2025/0126741 A1 Apr. 17, 2025

(51) Int. Cl.
*G05D 23/00* (2006.01)
*H05K 7/20* (2006.01)

(52) U.S. Cl.
CPC ..... *H05K 7/20154* (2013.01); *H05K 7/20209* (2013.01)

(58) Field of Classification Search
CPC .......... H05K 7/20154; H05K 7/20206
USPC ........................................ 165/287
See application file for complete search history.

(56) References Cited

U.S. PATENT DOCUMENTS

| 9,625,220 B1* | 4/2017 | Ahbel ............... H01L 23/34 |
| 9,644,907 B1* | 5/2017 | Ahbel ............... F28F 13/08 |
| 10,247,489 B2* | 4/2019 | Ahbel ............... F28F 27/02 |
| 2007/0169928 A1* | 7/2007 | Dayan ............... H01L 23/34 |
| | | 257/E23.099 |

FOREIGN PATENT DOCUMENTS

TW 201637551 A * 10/2016

* cited by examiner

*Primary Examiner* — Davis D Hwu
(74) *Attorney, Agent, or Firm* — Joseph Mencher

(57) ABSTRACT

A networking module cooling system includes a networking module connected to a networking device, and a temperature-based heat sink airflow channel adjustment system coupled to the networking module. The temperature-based heat sink airflow channel adjustment system includes a heat sink base, fixed heat sink fin subsystem(s) extending from the heat sink base and defining a first heat sink airflow sub-channel, and moveable heat sink fin subsystem(s) coupled to the heat sink base and defining a second heat sink airflow sub-channel adjacent the first heat sink airflow sub-channel. A heat-activated actuator subsystem coupled to the heat sink base is configured, in response to the heat sink base receiving heat generated by the networking module, to move the moveable heat sink fin subsystem(s) relative to the fixed heat sink fin subsystem(s) to adjust a size of a heat sink airflow channel provided by the first and second heat sink airflow sub-channels.

20 Claims, 18 Drawing Sheets

TEMPERATURE-BASED HEAT SINK AIRFLOW CHANNEL ADJUSTMENT SYSTEM

BACKGROUND

The present disclosure relates generally to information handling systems, and more particularly to adjusting heat sink airflow channels provided on heat sinks used with an information handling system based on temperature.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, networking devices (e.g., switch devices) and/or other computing devices known in the art sometimes utilize networking modules (e.g., Direct-Attach Cables (DAC) modules, Small Form-factor Pluggable (SFP) transceiver modules, Octal Small Form-factor Pluggable (OSFP) transceiver modules, Quad Small Form-factor Pluggable (QSFP) transceiver modules, and/or other networking modules known in the art) in order to transmit and receive data. As will be appreciated by one of skill in the art in possession of the present disclosure, such networking modules continue to increase in the amount of power they use in their operations (e.g., with DAC modules currently utilizing 0 watts of power, SFP+ transceiver modules currently utilizing 0.5-1 watt of power, QSFP+ transceiver modules currently utilizing 4.5 watts of power, QSFP Double Density (DD) transceiver modules utilizing 5-20 watts of power, and the power consumption of future transceiver modules expected to continue to increase).

In order to dissipate the heat generated by its networking modules due to their power consumption, a networking device may activate its fan system to generate an airflow in the networking device that draws air through a first surface on the networking device that is located adjacent networking device connectors to which the networking modules are connected to, and out of a second surface on the networking device that is opposite that first surface, which one of skill in the art in possession of the present disclosure will appreciate will cause air to move past the networking modules and over heat sinks that are provided on those networking modules to dissipate the heat they generate during their operation. However, networking devices will often utilize combinations of the networking modules described above that consume different amounts of power and thus produce different amounts of heat, each of which may be connected to the networking device via any of its networking module connectors. The variations in the utilization of power and the production of heat by different networking modules can raise some issues.

For example, the networking modules and heat sinks discussed above tend to have the same or similar form-factors, and thus the operation of the fan system in the networking device as discussed above operates to draw approximately equal portions of the airflow past each of the networking modules. As such, relatively lower-power-consuming networking modules will utilize the same portion of the airflow as relatively higher-power-consuming networking modules, often resulting in the relatively lower-power-consuming networking modules being over-cooled (e.g., when the fan system operates to produce an airflow than is higher than needed by the relatively lower-power-consuming networking modules due to the cooling requirements of the relatively higher-power-consuming networking modules) or the relatively higher-power-consuming networking modules being under-cooled (e.g., when the relatively lower-power-consuming networking modules utilize a portion of the airflow produced by the fan system such that it is unable to meet the cooling requirements of the relatively higher-power-consuming networking modules). As such, conventional networking module cooling systems are inefficient and costly due to the need to produce airflows sufficient to cool the highest power consuming networking modules, and may be unable to meeting cooling requirements of those highest power consuming networking modules in some situations.

Accordingly, it would be desirable to provide a networking module cooling system that addresses the issues discussed above.

SUMMARY

According to one embodiment, a temperature-based heat sink airflow channel adjustment system includes a heat sink base that is configured to receive heat generated by a networking module when the heat sink base is coupled to the networking module; at least one fixed heat sink fin subsystem that extends from the heat sink base and that defines a first heat sink airflow sub-channel; at least one movable heat sink fin subsystem that is coupled to the heat sink base, that defines a second heat sink airflow sub-channel that is located adjacent the first heat sink airflow sub-channel, and that is configured to move relative to the at least one fixed heat sink fin subsystem; and a heat-activated actuator subsystem that is coupled to the heat sink base and that is configured, in response to the heat sink base receiving heat generated by a networking module when the heat sink base is coupled to the networking module, to move the at least one moveable heat sink fin subsystem relative to the at least one fixed heat sink fin subsystem to adjust a size of a heat sink airflow channel provided by the first heat sink airflow sub-channel and the second heat sink airflow sub-channel.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
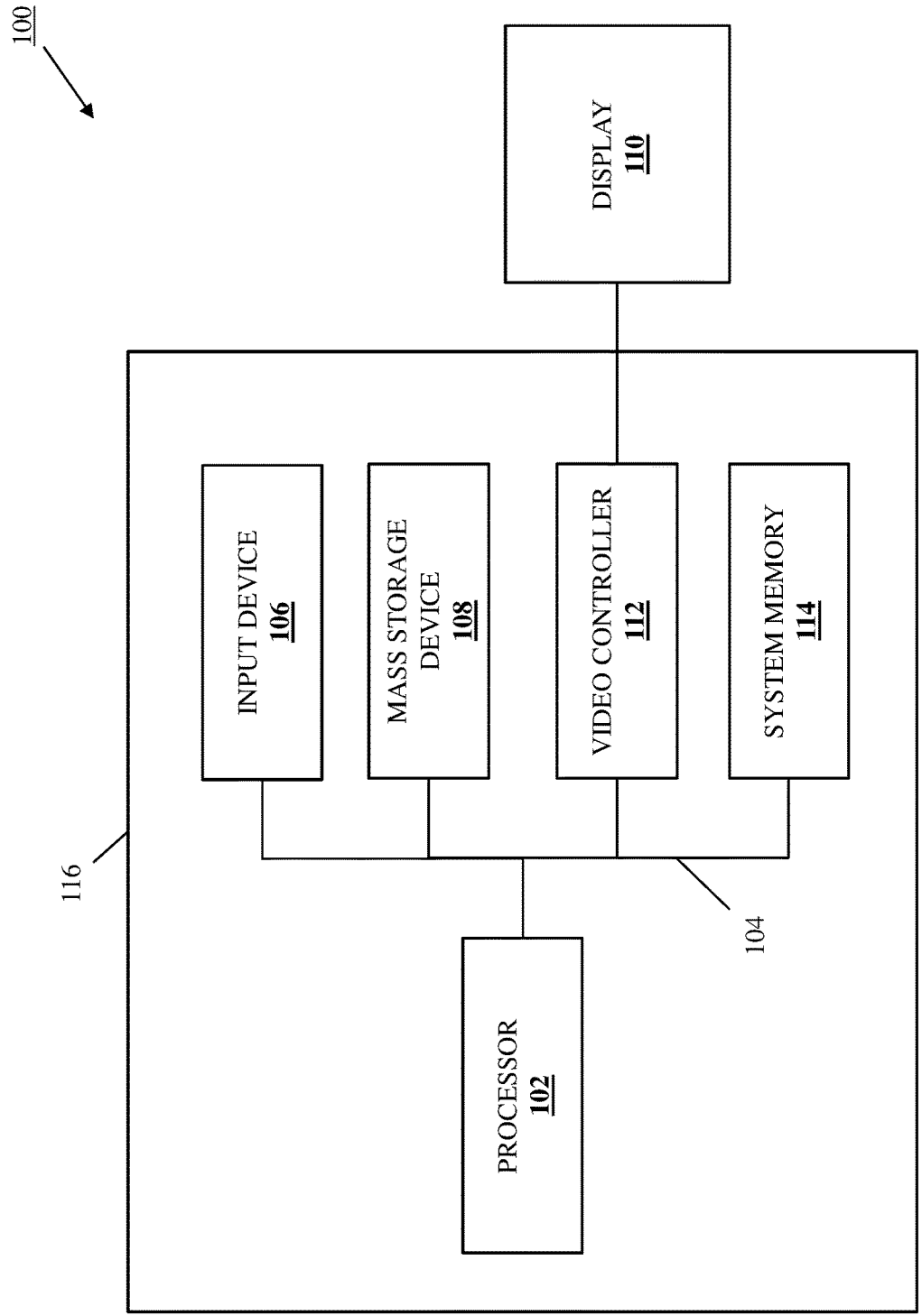
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
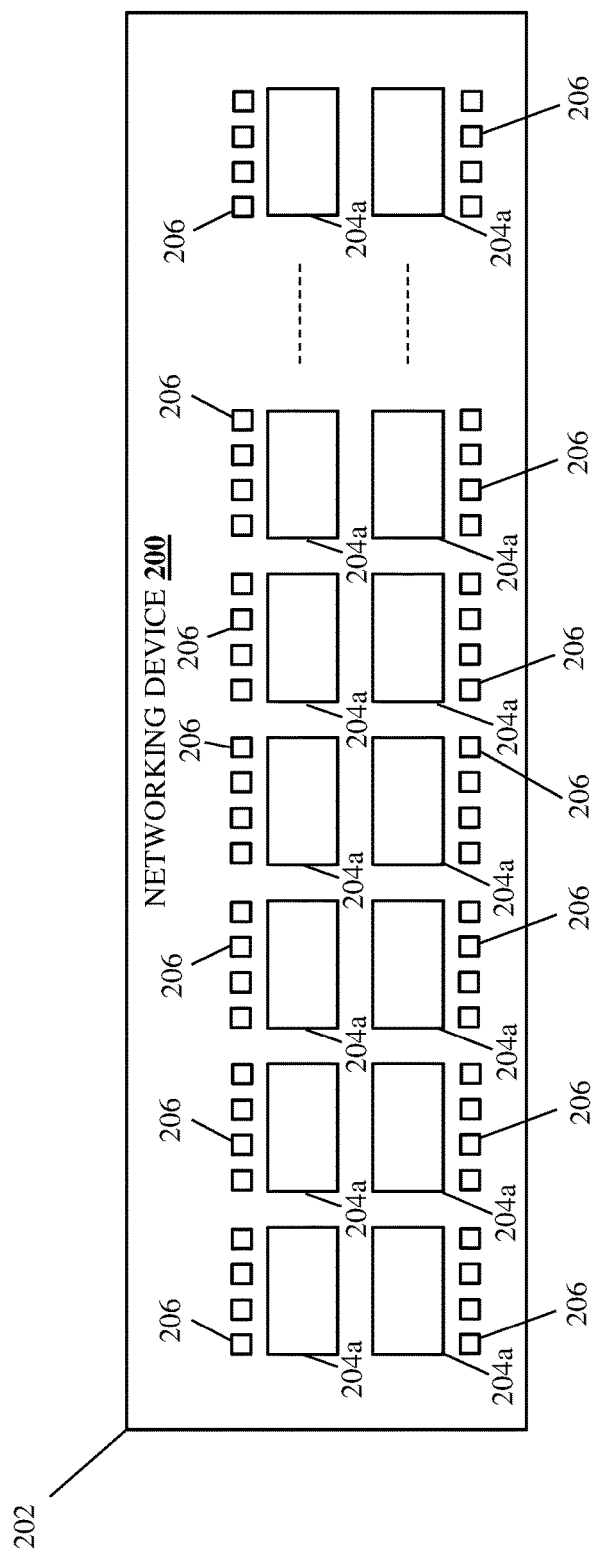
FIG. 2A is a front schematic view illustrating an embodiment of a networking device that may include or be utilized with the temperature-based heat sink airflow channel adjustment system of the present disclosure.
Figure 2B:
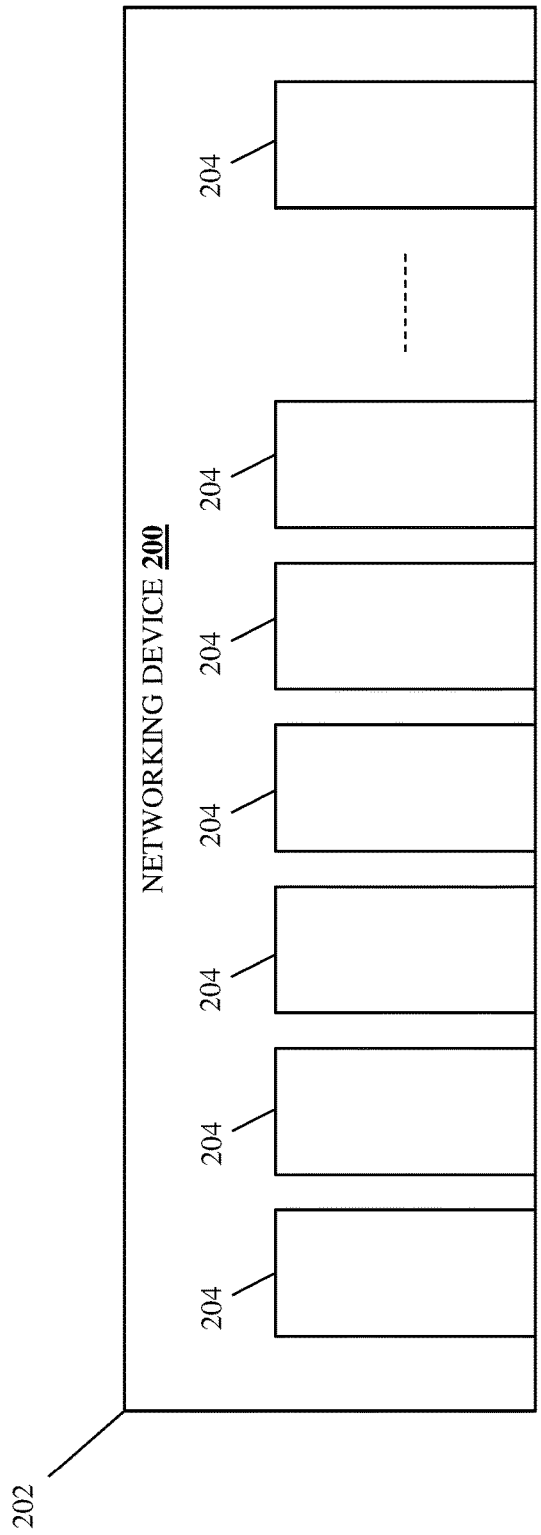
FIG. 2B is a schematic view illustrating an embodiment of the networking device of FIG. 2A.

Referring now to FIGS. 2A and 2B, an embodiment of a networking device 200 is illustrated that may include or be utilized with the temperature-based heat sink airflow channel adjustment system of the present disclosure. In an embodiment, the networking device 200 may be provided by the IHS 100 discussed above with reference to FIG. 1 and/or may include some or all of the components of the IHS 100, and in specific examples may be provided by a switch device. However, while illustrated and discussed as being provided by switch devices or other networking devices known in the art, one of skill in the art in possession of the present disclosure will recognize that the functionality of the networking devices 200 discussed below may be provided by other computing devices that are configured to operate similarly as the networking device 200 discussed below.

In the illustrated embodiment, the networking device 200 includes a chassis 202 that houses the components of the networking device 200, only some of which are illustrated and discussed below. For example, the chassis 202 may house a processing system (not illustrated, but which may be similar to the processor 102 discussed above with reference to FIG. 1 and may be provided by a Network Processing Unit (NPU) and/or other networking processing systems that would be apparent to one of skill in the art in possession of the present disclosure) and a memory system (not illustrated, but which may be similar to the memory 114 discussed above with reference to FIG. 1) that is coupled to the processing system and that includes instructions that, when executed by the processing system, cause the processing system to perform any networking functionality that would be apparent to one of skill in the art in possession of the present disclosure.

As illustrated, the chassis 302 may also house a plurality of networking module coupling chassis 204 that one of skill in the art in possession of the present disclosure will appreciate may be provided by networking module "cages" (e.g., transceiver cages) that may each be mounted to a circuit board in the chassis 202 adjacent respective networking module connectors that are configured to couple networking modules to the processing system discussed above. However, while specific networking module coupling chassis have been described, one of skill in the art in possession of the present disclosure will appreciate how other networking module coupling chassis will fall within the scope of the present disclosure as well.

In the illustrated embodiment, a respective networking module connector port 204a is defined on a "front" surface of the chassis 202 adjacent each networking module coupling chassis (including the networking module coupling chassis 204 visible in FIG. 2A), and one of skill in the art in possession of the present disclosure will recognize how the networking module connector ports 204a are configured to allow networking modules to be inserted in the networking module coupling chassis 204 to connect to the networking device connectors described above. Furthermore, a plurality of airflow apertures 206 are defined by the chassis 202 adjacent each of the networking module connector ports 204a, and while not illustrated one of skill in the art in possession of the present disclosure will appreciate how the networking device 200 may include a fan system in the chassis 202 that is configured to generate an airflow that draws air through the airflow apertures 206 on the front surface of the chassis 202 and expels that air out of a "rear" surface of the chassis 202 (e.g., via airflow apertures that are similar to the airflow apertures 206). However, while a specific networking device 200 has been illustrated and described, one of skill in the art in possession of the present disclosure will recognize that networking devices (or other devices operating according to the teachings of the present disclosure in a manner similar to that described below for the networking device 200) may include a variety of components and/or component configurations for providing conventional networking device functionality, as well as the functionality discussed below, while remaining within the scope of the present disclosure as well.

Figure 3A:
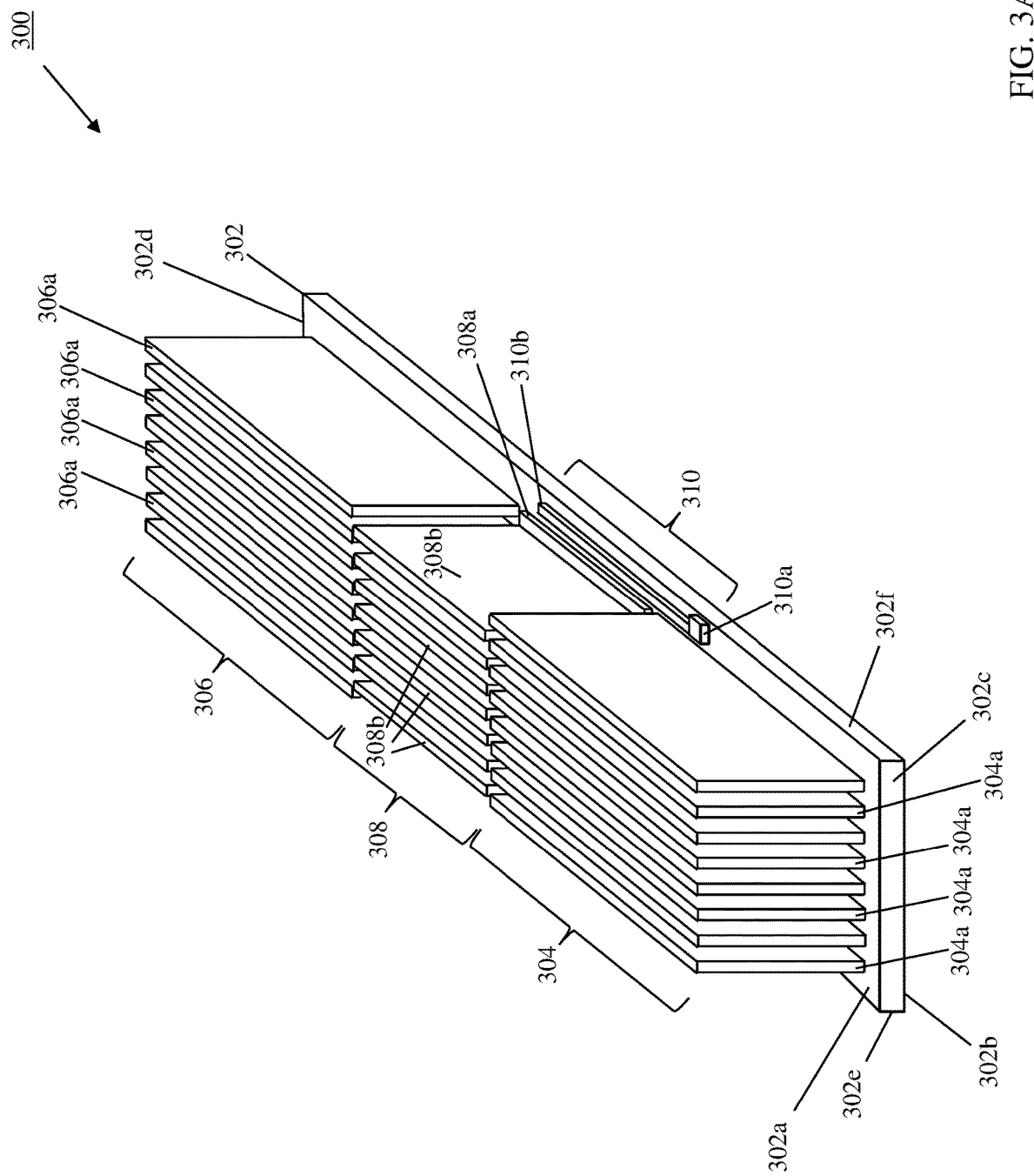
FIG. 3A is a perspective view illustrating an embodiment of a temperature-based heat sink airflow channel adjustment system provided according to the teachings of the present disclosure.
Figure 3B:
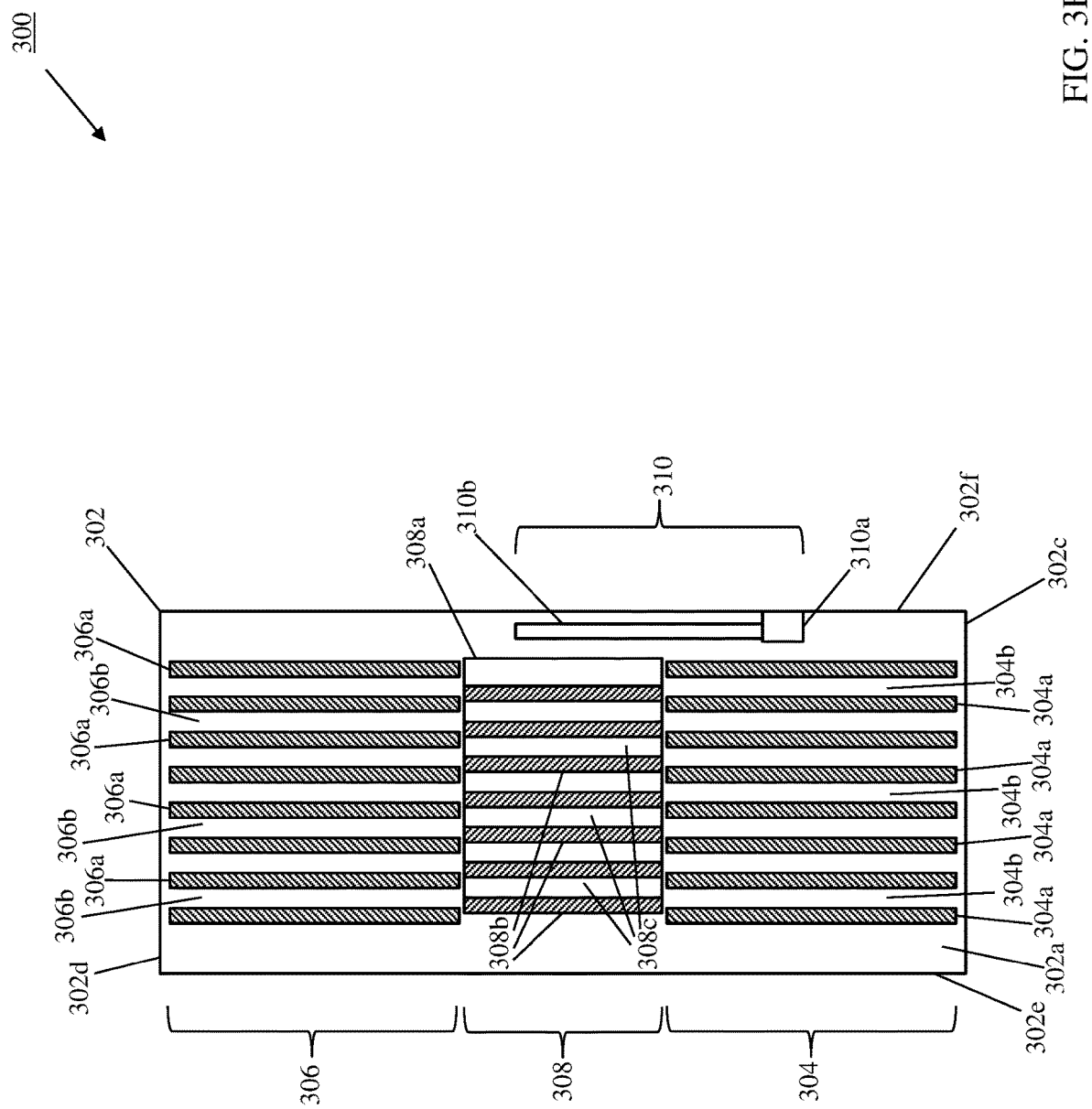
FIG. 3B is a top view illustrating an embodiment of the temperature-based heat sink airflow channel adjustment system of FIG. 3A.
Figure 3C:
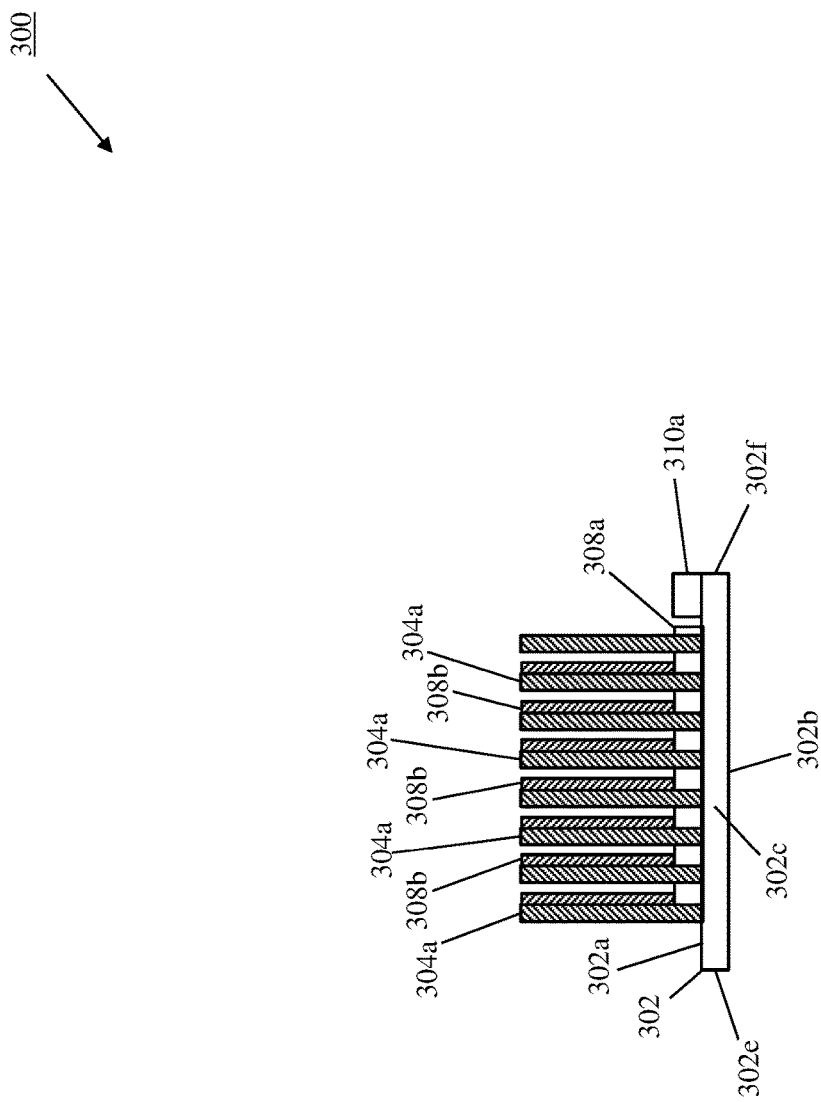
FIG. 3C is a front view illustrating an embodiment of the temperature-based heat sink airflow channel adjustment system of FIG. 3A.

With reference to FIGS. 3A, 3B, and 3C, an embodiment of a temperature-based heat sink airflow channel adjustment system 300 is illustrated that may be provided according to the teachings of the present disclosure. In the illustrated embodiment, the temperature-based heat sink airflow channel adjustment system 300 includes a heat sink base 302 having a top surface 302a, a bottom surface 302b that is located opposite the heat sink base 302 from the top surface 302a, a front surface 302c that extends between the top surface 302a and the bottom surface 302b, a rear surface 302d that is located opposite the heat sink base 302 from the front surface 302c and that extends between the top surface 302a and the bottom surface 302b, and a pair of opposing side surfaces 302e and 302f that are located opposite the heat sink base 302 from each other and that extend between the top surface 302a, the bottom surface 302b, the front surface 302c, and the rear surface 302d. One of skill in the art in possession of the present disclosure will appreciate how the heat sink base 302 may be provided using any of a variety of heat transfer materials known in the art.

In the illustrated embodiment, a first fixed heat sink fin subsystem 304 is included on the heat sink base 302 and may be provided using any of a variety of heat transfer materials known in the art. For example, the first fixed heat sink fin subsystem 304 is located on the top surface 302a of the heat sink base 302 and includes a plurality of heat sink fins 304a that extend from the heat sink base 302 between the side surfaces 302e and 302f adjacent the front surface 302c in a spaced-apart orientation from each other to define a first fixed heat sink airflow sub-channel 304b. In the specific example illustrated in FIG. 3A-3C, the first fixed heat sink fin subsystem 304 includes eight heat sink fins 304a that define the first fixed heat sink airflow sub-channel 304b via the seven volumes between them, but one of skill in the art in possession of the present disclosure will appreciate how the fixed heat sink airflow sub-channel(s) of the present disclosure may be defined in a variety of manners that will fall within the scope of the present disclosure as well.

In the illustrated embodiment, a second fixed heat sink fin subsystem 306 is included on the heat sink base 302 and may be provided using any of a variety of heat transfer materials known in the art. For example, the second fixed heat sink fin subsystem 306 is located on the top surface 302a of the heat sink base 302 in a spaced-apart orientation from the first fixed heat sink fin subsystem 306, and includes a plurality of heat sink fins 306a that extend from the heat sink base 302 between the side surfaces 302e and 302f adjacent the rear surface 302d in a spaced-apart orientation from each other to define a second fixed heat sink airflow sub-channel 306b. In the specific example illustrated in FIG. 3A-3C, the second fixed heat sink fin subsystem 306 includes eight heat sink fins 306a that define the second fixed heat sink airflow sub-channel 306b via the seven volumes between them, but one of skill in the art in possession of the present disclosure will appreciate how the fixed heat sink airflow sub-channel(s) of the present disclosure may be defined in a variety of manners that will fall within the scope of the present disclosure as well. As will be appreciated by one of skill in the art in possession of the present disclosure, in the embodiment illustrated and described below, each of the eight heat sink fins 306a on the second fixed heat sink fin subsystem 306 are aligned with a corresponding one of the eight heat sink fins 304a on the first fixed heat sink fin subsystem 304 such that each of the seven volumes that provide the second fixed heat sink airflow sub-channel 306b are aligned with a corresponding one of the seven volumes that provide the first fixed heat sink airflow sub-channel 304b.

A moveable heat sink fin subsystem 308 is included on the heat sink base 302 and may be provided using any of a variety of heat transfer materials known in the art. For example, the moveable heat sink fin subsystem 308 may be moveably coupled to the heat sink base 302 adjacent the first and second fixed heat sink fin subsystems 304 and 306, and in the illustrated embodiment includes a moveable base 308a that is moveably coupled to the top surface 302a of heat sink base 302 between the first and second fixed heat sink fin subsystems 304 and 306, with a plurality of heat sink fins 308b each extending from the moveable base 308a in a spaced-apart orientation from each other to define a moveable heat sink airflow sub-channel 308c. In the specific example illustrated in FIG. 3A-3C, the moveable heat sink fin subsystem 308 includes seven heat sink fins 308b that define the moveable heat sink airflow sub-channel 308c via the six volumes between them as well as the volume immediately adjacent the heat sink fin 308b that is closest to the side surface 302f of the heat sink base 302, but one of skill in the art in possession of the present disclosure will appreciate how the moveable heat sink airflow sub-channel(s) of the present disclosure may be defined in a variety of manners that will fall within the scope of the present disclosure as well.

A heat-activated actuator subsystem 310 is included on the heat sink base 302, and in the illustrated embodiment includes a heat-activated actuator mount 310a that is mounted to the top surface 302a of the heat sink base 302 adjacent the side surface 302f, and a heat-activated actuator element 310b that extends from the heat-activated actuator mount 310a and adjacent the moveable heat sink fin subsystem 308. In specific examples, the heat-activated actuator element 310b may be provided by a bi-metallic element (e.g., a steel/copper bimetallic element and/or other bi-metallic elements that would be apparent to one of skill in the art in possession of the present disclosure) that is configured to deform in response to heat in order to engage and move the moveable heat sink fin subsystem 308 in the specific examples illustrated in the figures described below. For example, the bending deformation of a straight bi-metallic element like the heat-activated actuator element 310b of the illustrated embodiments may be defined by the following equation:

$$s = \alpha L^2 dt/t$$

where s is a bending deformation (e.g., a deflection distance of the distal end of the bi-metallic heat-activated actuator element 310b opposite the heat-activated actuator mount 310a from its non-deflected orientation), α is a constant associated with the bi-metallic element (e.g., typically approximated at $14 \times 10^{-6}$ $K^{-1}$), L is the length of the bi-metallic element, dt is the change in temperature, and t is the thickness of the bimetallic element. To provide a specific example of the use of the equation above, a 50 millimeter long bi-metallic element with a thickness of 2 millimeters would provide a bending deformation of approximately 0.5 millimeters in response to an increase in temperature of 30 degrees Celsius.

However, one of skill in the art in possession of the present disclosure will appreciate how the simplified example of the straight bi-metallic element utilized in the embodiments illustrated and described below may not be ideal for the networking module cooling implementations described below, as the bending deformation of the bi-metallic element needed to provide the temperature-based heat sink airflow channel adjustments described below may require too large a length of the bi-metallic element. Furthermore, one of skill in the art in possession of the present disclosure will appreciate how different materials and configurations of bi-metallic elements/heat-activated actuator elements/heat-activated actuator subsystems may be utilized to allow the temperature-based heat sink airflow channel adjustments described below, including spiral shaped bi-metallic elements, helical shaped bi-metallic elements, and/or other bi-metallic element configurations that one of skill in the art in possession of the present disclosure would recognize as enabling the temperature-based heat sink airflow channel adjustments described below in a form-factor that provides a better "fit" on the temperature-based heat sink airflow channel adjustment system.

Further still, the simplified example illustrated and discussed below describes the heat-activated actuator element 310b moving (e.g., deforming) into engagement with the moveable heat sink fin subsystem 308 to move the moveable heat sink fin subsystem 308, and thus the moveable base 308a of the moveable heat sink fin subsystem 308 may be moveably coupled to the heat sink base 302 in a variety of manners (e.g., via a pin and slot, channels, etc.) that one of skill in the art in possession of the present disclosure would recognize as providing the movement of the moveable heat sink fin subsystem 308 illustrated and described below. In a specific example, such embodiments may provide a resilient element (e.g., a spring) that is coupled to the moveable heat sink fin subsystem 308 and configured to return the moveable heat sink find subsystem 308 to its initial orientation (e.g., the non-deformed orientation illustrated and described below) once the heat-activated actuator element 310b moves out of engagement with the moveable heat sink fin subsystem 308. However, in other examples, heat-activated actuator element 310b may be connected to the moveable heat sink fin subsystem 308 such that any movement (e.g., deformation) of the heat-activated actuator element 310b will result in movement of the moveable heat sink fin subsystem 308.

In the embodiment illustrated in FIGS. 3A, 3B, and 3C, the moveable heat sink fin subsystem 308 is illustrated in a reduced airflow orientation in which the heat-activated actuator subsystem 310 (e.g., the heat-activated actuator element 310a) has not moved (e.g., deformed) to move the moveable heat sink fin subsystem 308. For example, and as discussed in further detail below, in the embodiment illustrated in FIGS. 3A-3B the heat sink base 302 may not be conducting any heat (or may be conducting a relatively low amount of heat) to the heat-activated actuator subsystem 310, and at least a portion of each of the seven heat sink fins 308b on the moveable heat sink fin subsystem 308 is positioned between a respective aligned pair of the volumes that provide the first fixed heat sink airflow sub-channel 304b and the second fixed heat sink airflow sub-channel 306b. In other words, the alignment of any pair of the volumes that provide the first fixed heat sink airflow sub-channel 304b and the second fixed heat sink airflow sub-channel 306b may be configured to allow air to flow through those volumes, but the reduced airflow orientation of the moveable heat sink fin subsystem 308 positions a heat sink fin 308b between that pair of volumes to obstruct that flow of air.

One of skill in the art in possession of the present disclosure will appreciate how the specific example of the reduced airflow orientation of the moveable heat sink fin subsystem 308 illustrated and described in FIGS. 3A-3C provides for an approximate reduction of 50% of the airflow through the pairs of the volumes that provide the first fixed heat sink airflow sub-channel 304b and the second fixed heat sink airflow sub-channel 306b. However, while a specific reduced airflow orientation is illustrated and described, one of skill in the art in possession of the present disclosure will appreciate how other reduced airflow orientations (e.g., providing for up to a 100% reduction in the airflow through the pairs of the volumes that provide the first fixed heat sink airflow sub-channel 304b and the second fixed heat sink airflow sub-channel 306b) will fall within the scope of the present disclosure as well. However, while several specific examples of configurations of the temperature-based heat sink airflow channel adjustment system 300 have been illustrated and described, one of skill in the art in possession of the present disclosure will appreciate how the temperature-based heat sink airflow channel adjustment system of the present disclosure may include a variety of components and/or component configurations that will fall within the scope of the present disclosure.

Figure 4A:
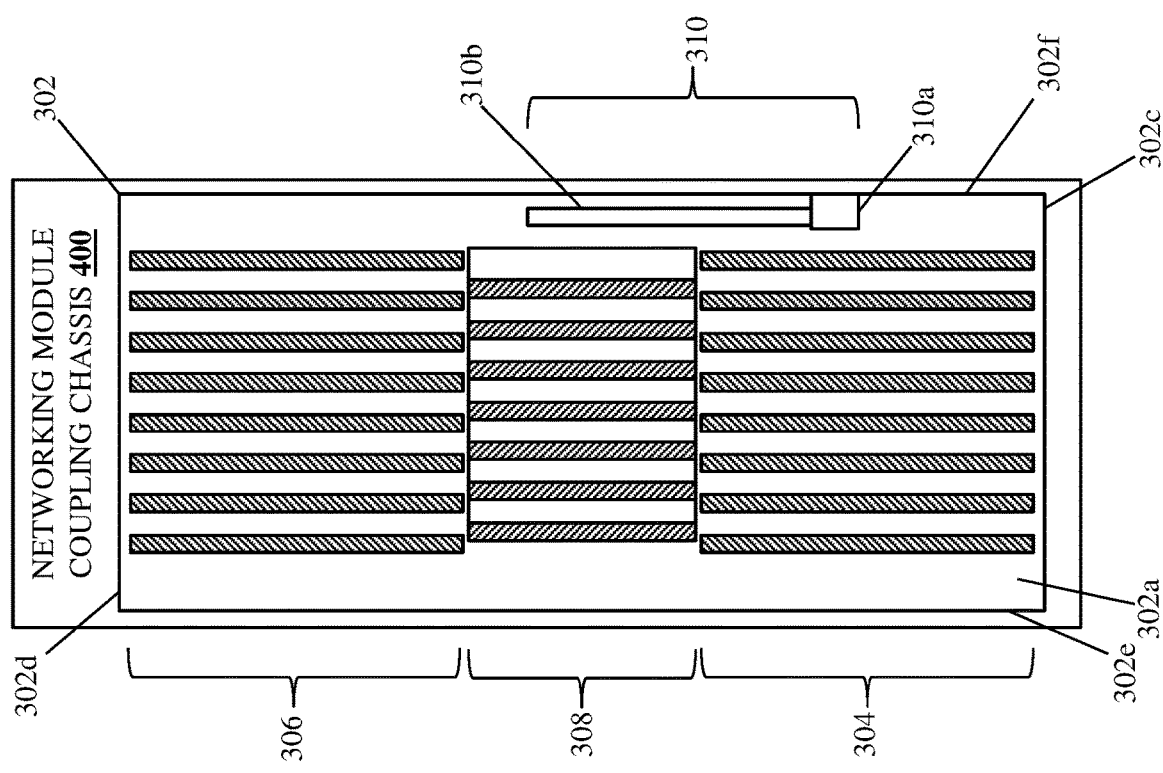
FIG. 4A is a top view illustrating an embodiment of a networking module coupling chassis including the temperature-based heat sink airflow channel adjustment system of FIGS. 3A-3C.
Figure 4B:
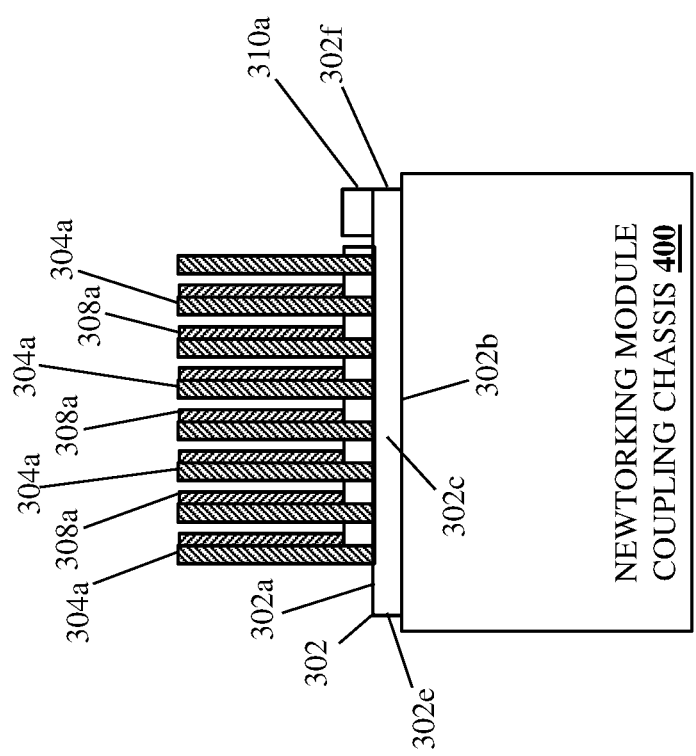
FIG. 4B is a front view illustrating an embodiment of the networking module coupling chassis of FIG. 4A.

With reference to FIGS. 4A and 4B, an embodiment of a networking module coupling chassis 400 is illustrated that may provide any or each of the networking module coupling chassis 204 discussed above with reference to the networking device 200 of FIG. 2, and thus may be provided by networking module "cages" (e.g., transceiver cages) that may each be mounted to a circuit board in the chassis 202 of the networking device 200 adjacent respective networking module connectors that are configured to couple networking modules to the processing system in the networking device 200 discussed above. As can be seen, the temperature-based heat sink airflow channel adjustment system 300 discussed above with reference to FIGS. 3A-3C may be provided on a surface (e.g., a "top" surface) of the networking module coupling chassis 400, and one of skill in the art in possession of the present disclosure will appreciate how the temperature-based heat sink airflow channel adjustment system 300 may be integrated into the networking module coupling chassis 400, may be connected to the networking module coupling chassis 400 (e.g., as a "riding" heat sink) using any of a variety of heat transfer couplings (e.g., thermal paste, etc.), and/or may be provided on the networking module coupling chassis 400 using other techniques that would be apparent to one of skill in the art in possession of the present disclosure. However, while specific example of a networking module coupling chassis including the temperature-based heat sink airflow channel adjustment system of the present disclosure has been illustrated and described, one of skill in the art in possession of the present disclosure will appreciate how other networking module coupling chassis will fall within the scope of the present disclosure as well.

Figure 5A:
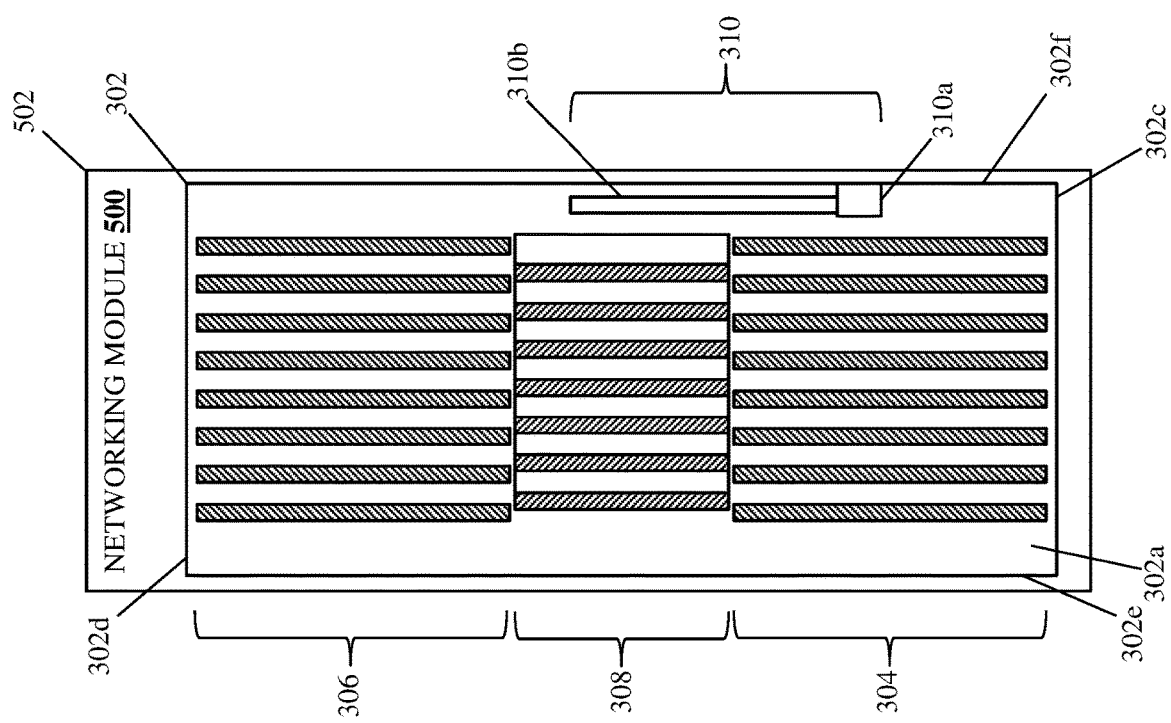
FIG. 5A is a top view illustrating an embodiment of a networking module including the temperature-based heat sink airflow channel adjustment system of FIGS. 3A-3C.
Figure 5B:
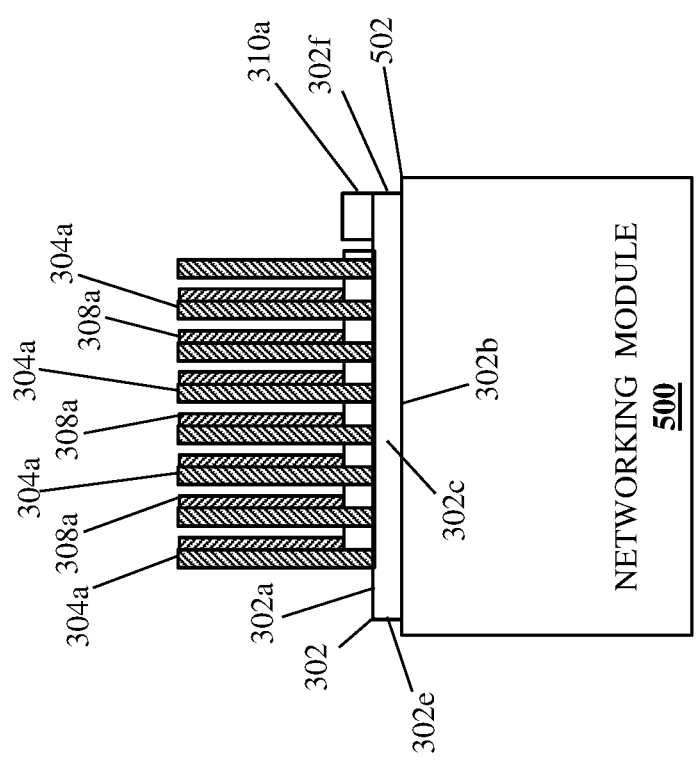
FIG. 5B is a front view illustrating an embodiment of a networking module of FIG. 5A.

With reference to FIGS. 5A and 5B, an embodiment of a networking module 500 is illustrated that may be used with the networking device 200 of FIG. 2, and thus may be provided by a Small Form-factor Pluggable (SFP) transceiver module, an Octal Small Form-factor Pluggable (OSFP) transceiver module, a Quad Small Form-factor Pluggable (QSFP) transceiver module, and/or other networking modules that would be apparent to one of skill in the art in possession of the present disclosure. In an embodiment, the networking module 500 includes a chassis 502 that houses the components of the networking module 500. As can be seen, the temperature-based heat sink airflow channel adjustment system 300 discussed above with reference to FIGS. 3A-3C may be provided on a surface (e.g., a "top" surface) of the chassis 502 of the networking module 500, and one of skill in the art in possession of the present disclosure will appreciate how the temperature-based heat sink airflow channel adjustment system 300 may be integrated into the chassis 502, may be connected to the chassis 502 (e.g., as a "riding" heat sink) using any of a variety of heat transfer couplings (e.g., thermal paste, etc.), and/or may be provided on the chassis 502 using other techniques that would be apparent to one of skill in the art in possession of the present disclosure. However, while specific example of a networking module including the temperature-based heat sink airflow channel adjustment system of the present disclosure has been illustrated and described, one of skill in the art in possession of the present disclosure will appreciate how other networking modules will fall within the scope of the present disclosure as well.

Figure 6:
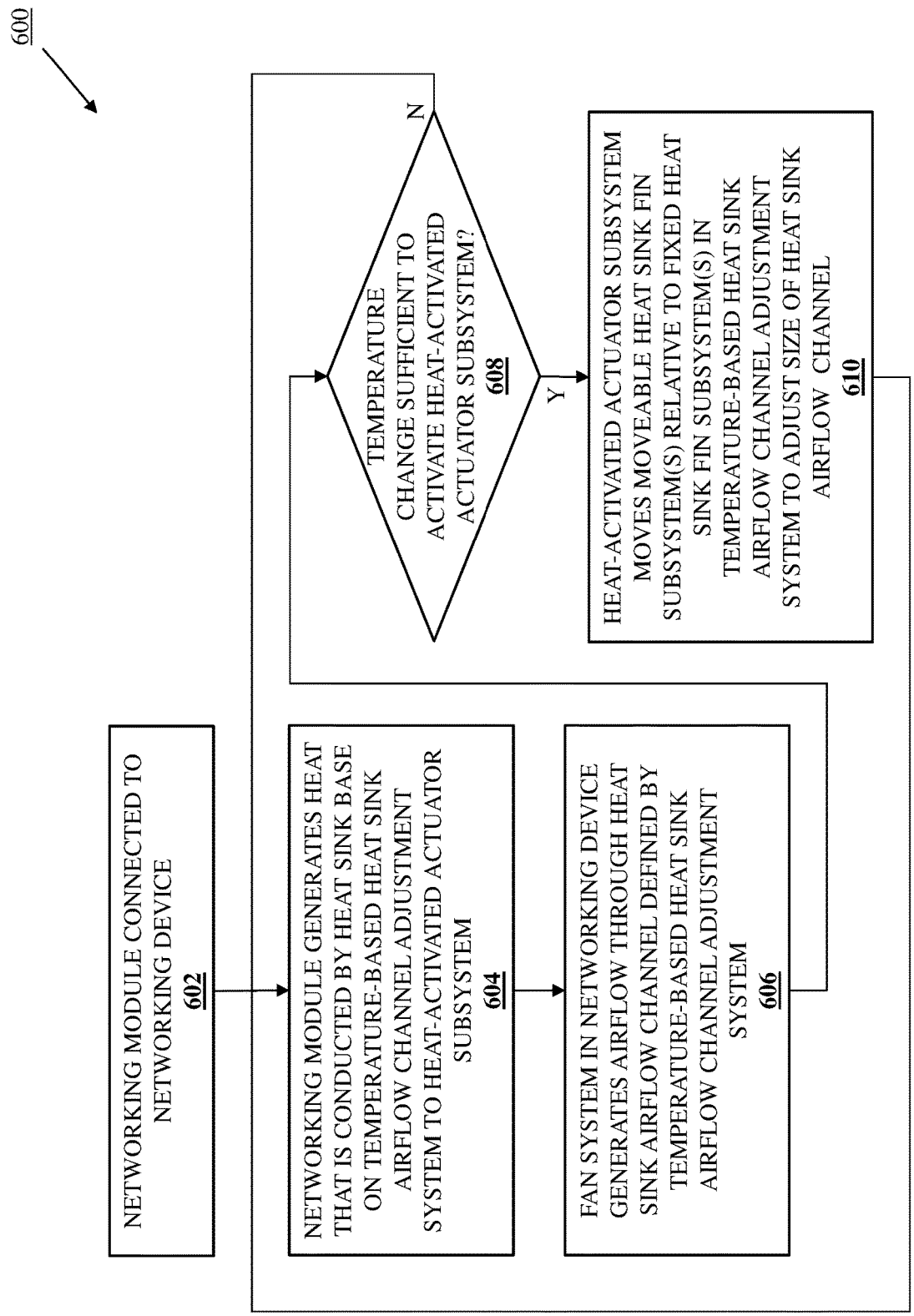
FIG. 6 is a flow chart illustrating an embodiment of a method for adjusting heat sink airflow channels based on temperature.

Referring now to FIG. 6, an embodiment of a method 600 for adjusting heat sink airflow channels based on temperature is illustrated. As discussed below, the systems and methods of the present disclosure provide for the adjustment of a size of a heat sink airflow channel defined by a heat sink based on a temperature of the heat sink to reduce airflow through the heat sink at relatively lower temperatures, and increase airflow through the heat sink at relatively higher temperatures. For example, the networking module cooling system of the present disclosure may include a networking module connected to a networking device, and a temperature-based heat sink airflow channel adjustment system coupled to the networking module. The temperature-based heat sink airflow channel adjustment system includes a heat sink base, fixed heat sink fin subsystem(s) extending from the heat sink base and defining a first heat sink airflow sub-channel, and moveable heat sink fin subsystem(s) coupled to the heat sink base and defining a second heat sink airflow sub-channel adjacent the first heat sink airflow sub-channel. A heat-activated actuator subsystem coupled to the heat sink base is configured, in response to the heat sink base receiving heat generated by the networking module, to move the moveable heat sink fin subsystem(s) relative to the fixed heat sink fin subsystem(s) to adjust a size of a heat sink airflow channel provided by the first and second heat sink airflow sub-channels. As such, relatively higher temperature networking modules may utilize a larger portion of a cooling airflow from the networking device while relatively lower temperature networking modules utilize a smaller portion of that cooling airflow.

Figure 7:
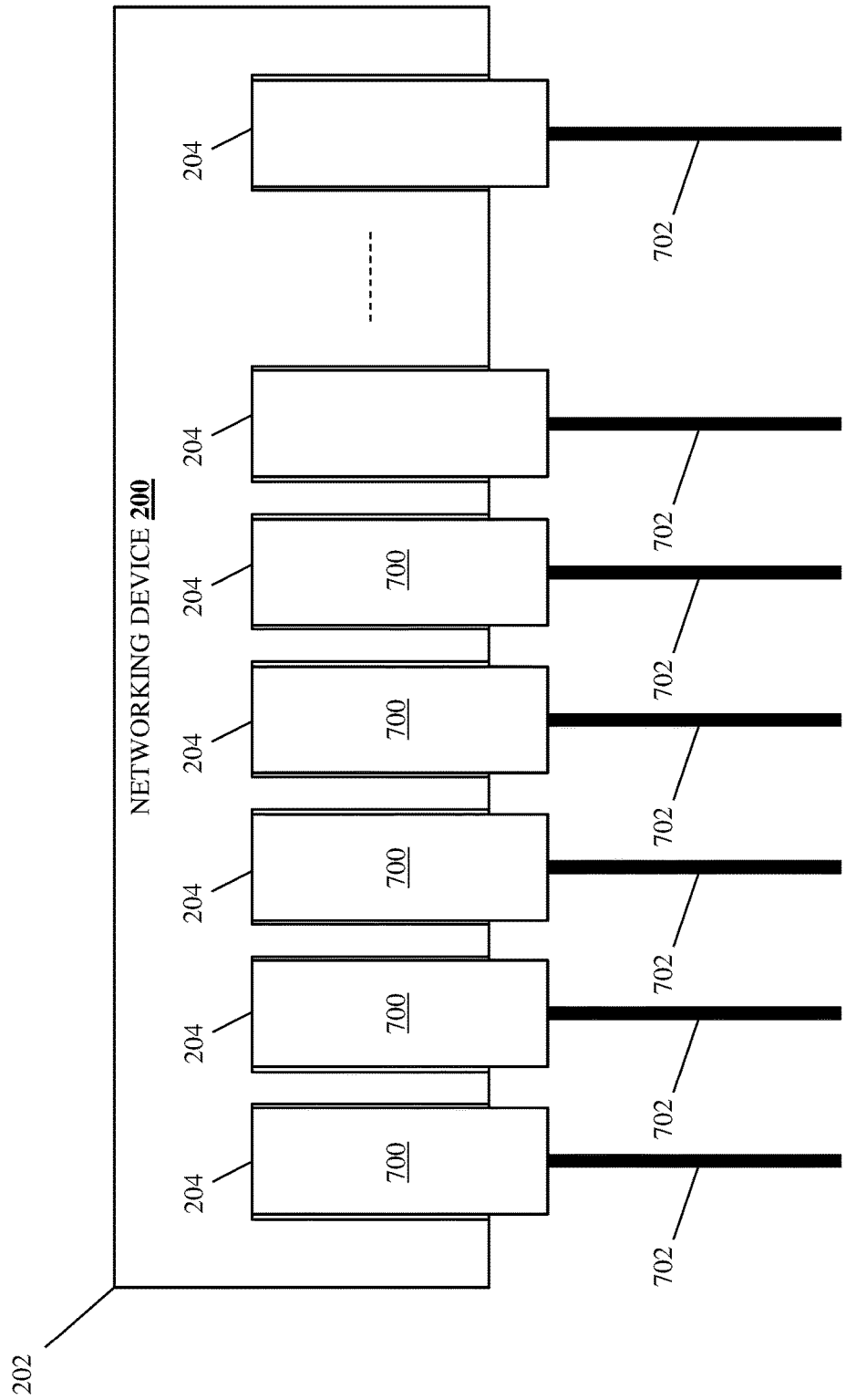
FIG. 7 is a schematic view illustrating an embodiment of networking modules connected to the networking device of FIG. 2 during the method of FIG. 6

The method 600 begins at block 602 where a networking module is connected to a networking device. With reference to FIG. 7, in an embodiment of block 602, a plurality of networking modules 700 may be connected to each of the networking module coupling chassis 204 in the networking device 200, and a respective cable 702 may be connected to each of the plurality of networking modules 700. Similarly as described above, the networking modules 700 may be provided by SFP transceiver modules, QSFP transceiver modules, OSFP transceiver modules, and/or other networking modules that would be apparent to one of skill in the art in possession of the present disclosure. As will be appreciated by one of skill in the art in possession of the present disclosure, in some embodiments the networking modules 700 may be provided by conventional networking modules that are connected to the networking module coupling chassis 400 discussed above that includes the integrated or connected temperature-based heat sink airflow channel adjustment system of the present disclosure. However, one of skill in the art in possession of the present disclosure will appreciate how, in other embodiments, the networking modules 700 may be provided by the networking modules 500 discussed above that include the integrated or connected temperature-based heat sink airflow channel adjustment system of the present disclosure, and are connected to conventional networking module coupling chassis.

As discussed above, the networking modules 700 coupled to the networking device 200 at block 602 may be configured to consume different amounts of power and/or otherwise generate different amounts of heat. For example, adjacent networking modules 700 may include a QSFP transceiver module that is configured to consume 5 watts of power and generate corresponding heat, a QSFP or OSFP transceiver module that is configured to consume 15 watts of power and generate corresponding heat (i.e., 3 times the heat of its adjacent transceiver module), a DAC module that is configured to consume 0 watts of power and generate little to no heat, etc. However, while a specific example has been provided, one of skill in the art in possession of the present disclosure will appreciate how a variety of different combinations of networking modules may be connected to a networking device while remaining within the scope of the present disclosure as well.

Figure 8A:
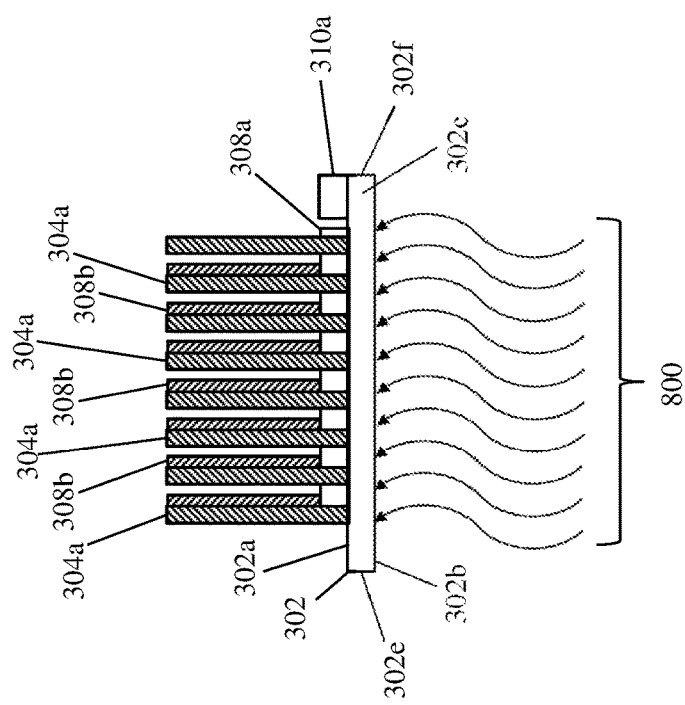
FIG. 8A is a perspective view illustrating an embodiment of the operation of the temperature-based heat sink airflow channel adjustment system of FIGS. 3A-3C during the method of FIG. 6.

The method 600 then proceeds to block 604 where the networking module generates heat that is conducted by a heat sink base in a temperature-based heat sink airflow channel adjustment system to its heat-activated actuator subsystem. In an embodiment, at block 604, any of the networking modules 700 may operate along with the networking device 200 to transmit data, receive data, and/or perform other networking module operations (e.g., transceiver module operations) that one of skill in the art in possession of the present disclosure will appreciate may consumer power and result in the generation of heat. With reference to FIG. 8A, the operation of any of the networking modules 700 may generate heat 800 (represented by the "wavy" arrows in FIG. 8A) that will be transferred to the heat sink base 302 of the temperature-based heat sink airflow channel adjustment system 300. As discussed in further detail below, the heat 800 generated at block 604 may be a relatively low heat (e.g., represented by relatively "thin" arrows in FIG. 8A) due to, for example, the networking module 700 having just begin its operation, the networking module 700 operating at a relatively low power consumption level, and/or due to other relatively low heat-producing scenarios that would be apparent to one of skill in the art in possession of the present disclosure.

As will be appreciated by one of skill in the art in possession of the present disclosure, in some embodiments the heat 800 illustrated in FIG. 8A may be generated by the networking module 500 that provides any of the networking modules 700, and transferred to its integrated or connected temperature-based heat sink airflow channel adjustment system 300. Furthermore, in other embodiments, the heat may be generated by the networking module 700, transferred to the networking module coupling chassis 400, and conducted by networking module coupling chassis 400 to its integrated or connected temperature-based heat sink airflow channel adjustment system 300. However, while two specific examples are provided, one of skill in the art in possession of the present disclosure will appreciate how the heat sink base 302 of the temperature-based heat sink airflow channel adjustment system 300 may receive heat generated by a heat-producing component in a variety of manners that will fall within the scope of the present disclosure as well.

As will be appreciated by one of skill in the art in possession of the present disclosure, the heat 800 received at the heat sink base 302 will be conducted by the heat sink base 302 to the first and second fixed heat sink fin subsystems 304 and 306 (e.g., to the heat sink fins 304a and 306a, respectively), to the moveable heat sink fin subsystem 308 (e.g., to the heat sink fins 308a via the moveable base 308a), and to the heat-activated actuator subsystem 310 (e.g., to the heat-activated actuator element 310b via the heat-activated actuator mount 310a). Furthermore, while a relatively simplified embodiment of the temperature-based heat sink airflow channel adjustment system 300 is provided, one of skill in the art in possession of the present disclosure will appreciate how thermal pastes, heat pipes, and/or other heat transfer elements known in the art may be utilized to transfer the heat 800 to the components of the temperature-based heat sink airflow channel adjustment system 300 while remaining within the scope of the present disclosure as well.

The method 600 then proceeds to block 606 where a fan system in the networking device generates an airflow through a heat sink airflow channel defined by the temperature-based heat sink airflow channel adjustment system. In an embodiment, at block 606, the fan system in the networking device 200 may be activated, adjusted, and/or may otherwise operate to generate an airflow past the temperature-based heat sink airflow channel adjustment system 300. For example, as described above, the operation of a fan system in the networking device 200 may draw air through the airflow apertures 206 on the front surface of the chassis 202 and expel that air out of a "rear" surface of the chassis 202, and one of skill in the art in possession of the present disclosure will appreciate how that airflow will move through a heat sink airflow channel defined by the temperature-based heat sink airflow channel adjustment system 300 (e.g., integrated in or connected to the networking module 500, integrated in or connected to the networking module coupling chassis 400, etc.) via its first and second fixed heat sink fin subsystems 304 and 306 and its moveable heat sink fin subsystem 308.

Figure 8B:
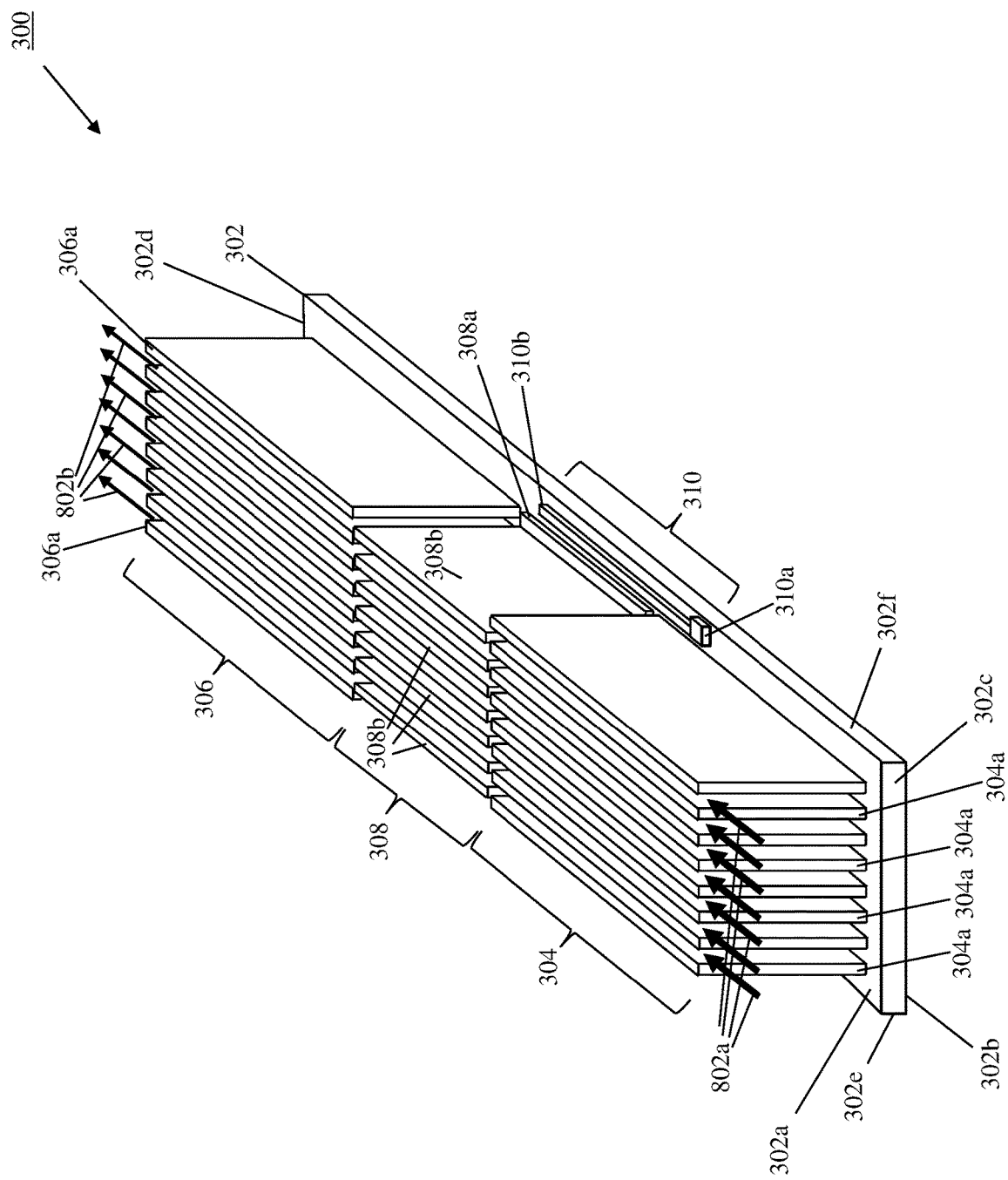
FIG. 8B is a top view illustrating an embodiment of the operation of the temperature-based heat sink airflow channel adjustment system of FIGS. 3A-3C during the method of FIG. 6.
Figure 8C:
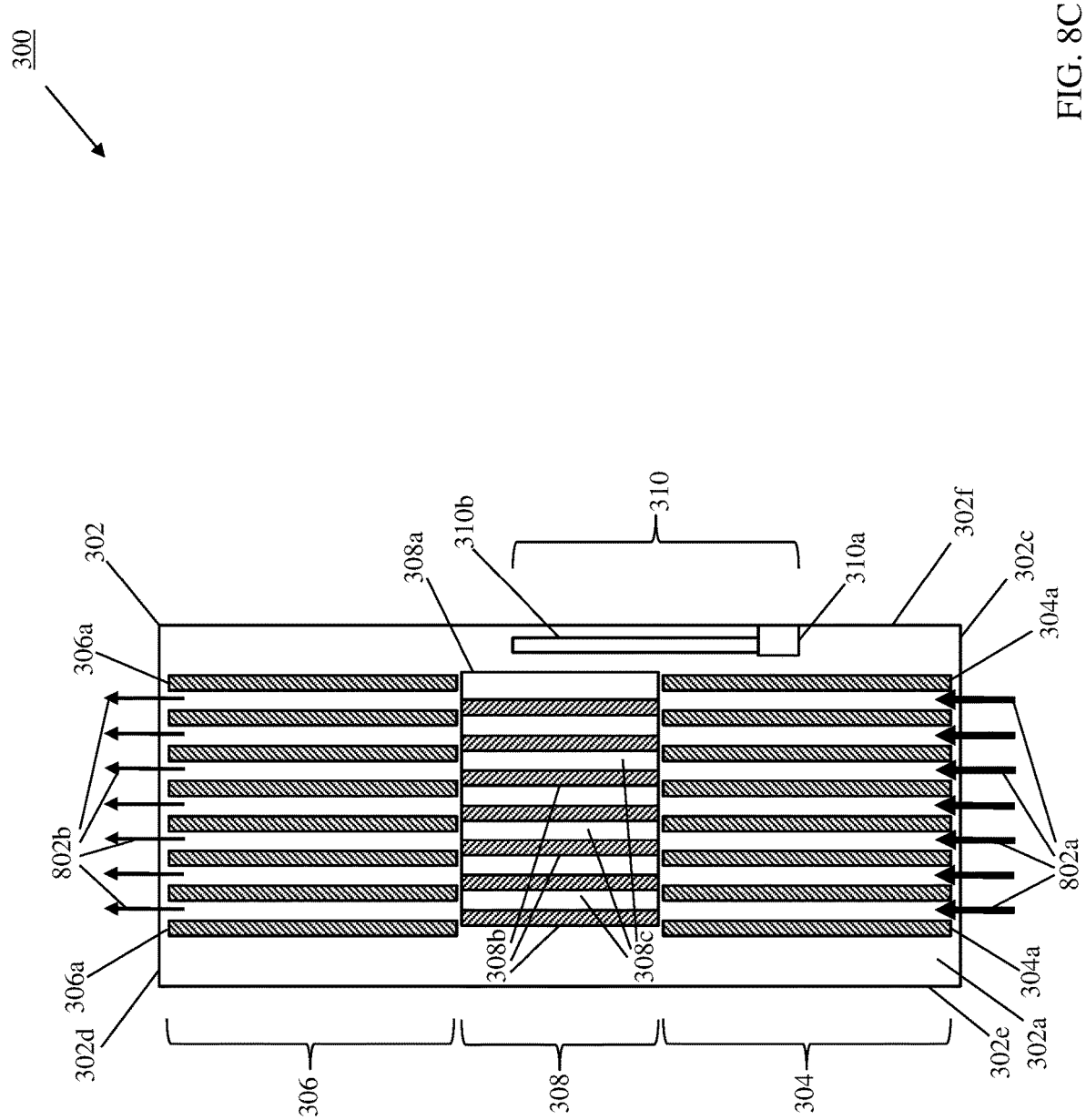
FIG. 8C is a front view illustrating an embodiment of the operation of the temperature-based heat sink airflow channel adjustment system of FIGS. 3A-3C during the method of FIG. 6.

With reference to FIGS. 8B and 8C, an embodiment of the airflow generated at block 606 is illustrated when the moveable heat sink fin subsystem 308 in the temperature-based heat sink airflow channel adjustment system 300 is provided in the reduced airflow orientation described above, and shows how a first airflow amount 802a of the portion of the airflow generated by the fan system in the networking device 200 may be provided at the first fixed heat sink fin subsystem 304, and a second airflow amount 802b that is less than the first airflow amount 802a (illustrated by "thinner" arrows 802b relative to the "bolder" arrows 802a) may exit the second fixed heat sink fin subsystem 306. As discussed above, the reduced airflow orientation of the moveable heat sink fin subsystem 308 positions at least a portion of each of the seven heat sink fins 308b on the moveable heat sink fin subsystem 308 between a respective aligned pair of the volumes that provide the first fixed heat sink airflow sub-channel 304b and the second fixed heat sink airflow sub-channel 306b in the first and second fixed heat sink fin subsystems 304 and 306 respectively, and operates to obstruct the flow of air through any aligned pair of the volumes that provide the first fixed heat sink airflow sub-channel 304b and the second fixed heat sink airflow sub-channel 306b.

As such, one of skill in the art in possession of the present disclosure will appreciate how only a portion of the first airflow amount 802a provided at the first fixed heat sink fin subsystem 304 may be allowed to flow through the heat sink airflow channel defined by the temperature-based heat sink airflow channel adjustment system 300 (e.g., defined by the first fixed heat sink airflow sub-channel 304b, the second fixed heat sink airflow sub-channel 306b, and the moveable heat sink airflow sub-channel 308c) such that the second airflow amount 802b that is less than the first airflow amount 802a exits the second fixed heat sink fin subsystem 306. In an embodiment, the reduced airflow orientation of the moveable heat sink fin subsystem 308 may be configured to allow an amount of airflow through the heat sink airflow channel defined by the temperature-based heat sink airflow channel adjustment system 300 that is sufficient to allow the temperature-based heat sink airflow channel adjustment system 300 to provide a minimum amount of cooling required by the networking module 700 and/or allow a cooling airflow to reach components in the networking device 200 (e.g., that are adjacent to, or otherwise receive cooling airflow via, the temperature-based heat sink airflow channel adjustment system 300).

The method 600 then proceeds to decision block 608 where the method 600 proceeds depending on whether a temperature change is sufficient to activate the heat-activated actuator subsystem. As will be appreciated by one of skill in the art in possession of the present disclosure, the conduction of heat by the heat sink base 302 to the heat-activated actuator subsystem 310 at block 604 and the generation of the airflow through the heat sink airflow channel at block 606 may operate to both heat and cool the heat-activated actuator subsystem 310. As such, one of skill in the art in possession of the present disclosure will appreciate how at decision block 608, the method 600 may proceed depending whether the heat conducted to the heat-activated actuator subsystem 310 at block 604 and the cooling provided at block 606 has increased or decreased the temperature of the heat-activated actuator subsystem 310 in an amount that is sufficient to activate the heat-activated actuator subsystem 310.

If, at decision block 608, no temperature change is sufficient to activate the heat-activated actuator subsystem, the method 600 returns to block 604. As will be appreciated by one of skill in the art in possession of the present disclosure, the heat-activated actuator subsystem 310 may be configured to move only in response to changes in its temperature. For example, one of skill in the art in possession of the present disclosure will recognize how the bi-metallic element that may provide the heat-activated actuator element 310b in the heat-activated actuator subsystem 310 may only deform (or return to its non-deformed orientation) in response to a temperature change, and thus in the event the heat produced by the networking module 700 and conducted to the heat-activated actuator subsystem 310 at block 604 is balanced by the cooling provided at block 606 (including when no heat is produced by the networking module 700), the heat-activated actuator subsystem 310 will not be activated and will remain in its current orientation (e.g., a deformed or non-deformed orientation). As such, the method 600 may loop such that the networking module 700 may continue to generate heat that is conducted to the heat-activated actuator subsystem 310 at block 604, and fan system may continue to generate airflow to cool the networking module 700 at block 606, until a temperature change of the heat-activated actuator subsystem 310 is sufficient to activate the heat-activated actuator subsystem 310.

Figure 9A:
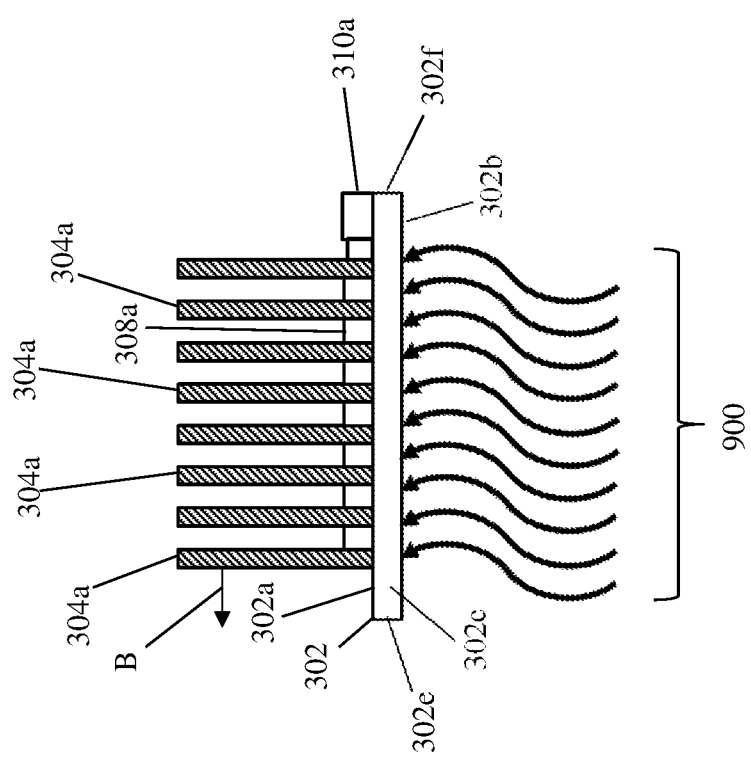
FIG. 9A is a perspective view illustrating an embodiment of the operation of the temperature-based heat sink airflow channel adjustment system of FIGS. 3A-3C during the method of FIG. 6.

If at decision block 608, a temperature change is sufficient to activate the heat-activated actuator subsystem, the method 600 proceeds to block 610 where the heat-activated actuator subsystem moves moveable heat sink fin subsystem(s) relative to fixed heat sink fin subsystem(s) in the temperature-based heat sink airflow channel adjustment system to adjust a size of the heat sink airflow channel. With reference to FIG. 9A, similarly as described above, the operation of any of the networking modules 700 may generate heat 900 (represented by the "wavy" arrows in FIG. 9A) that will be transferred to the heat sink base 302 of the temperature-based heat sink airflow channel adjustment system 300. In this embodiment, the heat 900 generated at block 606 may be a relatively high heat (e.g., represented by relatively "bold" arrows in FIG. 9A) as compared to the heat 800 discussed above with reference to FIG. 8A due to, for example, the networking module 700 increasing its operating level, the networking module 700 operating at a relatively high power consumption level, and/or due to other relatively high heat-producing scenarios that would be apparent to one of skill in the art in possession of the present disclosure.

Similarly as described above, in some embodiments the heat 900 illustrated in FIG. 9A may be generated by the networking module 500 that provides any of the networking modules 700, and transferred to its integrated or connected temperature-based heat sink airflow channel adjustment system 300. Furthermore, in other embodiments, the heat may be generated by the networking module 700, transferred to the networking module coupling chassis 400, and conducted by networking module coupling chassis 400 to its integrated or connected temperature-based heat sink airflow channel adjustment system 300. However, while two specific examples are provided, one of skill in the art in possession of the present disclosure will appreciate how the heat sink base 302 of the temperature-based heat sink airflow channel adjustment system 300 may receive heat generated by a heat-producing component in a variety of manners that will fall within the scope of the present disclosure as well.

Similarly as described above, the heat 900 received at the heat sink base 302 will be conducted by the heat sink base 302 to the first and second fixed heat sink fin subsystems 304 and 306 (e.g., to the heat sink fins 304a and 306a, respectively), to the moveable heat sink fin subsystem 308 (e.g., to the heat sink fins 308a via the moveable base 308a), and to the heat-activated actuator subsystem 310 (e.g., to the heat-activated actuator element 310b via the heat-activated actuator mount 310a). Furthermore, while a relatively simplified embodiment of the temperature-based heat sink airflow channel adjustment system 300 is provided, one of skill in the art in possession of the present disclosure will appreciate how thermal pastes, heat pipes, and/or other heat transfer elements known in the art may be utilized to transfer the heat 900 to the components of the temperature-based heat sink airflow channel adjustment system while remaining within the scope of the present disclosure as well.

In an embodiment of block 610 and in response to the temperature change being sufficient to activate the heat-activated actuator subsystem 310 at decision block 608, the heat-activated actuator subsystem 310 will move the moveable heat sink fin subsystem 308 relative to the first and second fixed heat sink fin subsystem 304 and 306 and adjust a size of the heat sink airflow channel defined by the temperature-based heat sink airflow channel adjustment system 300 (e.g., defined by the first fixed heat sink airflow sub-channel 304b, the second fixed heat sink airflow sub-channel 306b, and the moveable heat sink airflow sub-channel 308c). For example, with reference to FIGS. 9B and 9C, the heat conducted by the heat sink base 302 via the heat-activated actuator mount 310a to the heat-activated actuator element 310b in the heat-activated actuator subsystem 310 at block 604 combined with the cooling provided by block 606 may result in an increase in temperature of the heat-activated actuator element 310b that causes the heat-activated actuator element 310b to move (e.g., deform) in a direction A to cause the moveable heat sink fin subsystem 308 to move in a direction B relative to the first and second fixed heat sink fin subsystem 304 and 306.

Figure 9B:
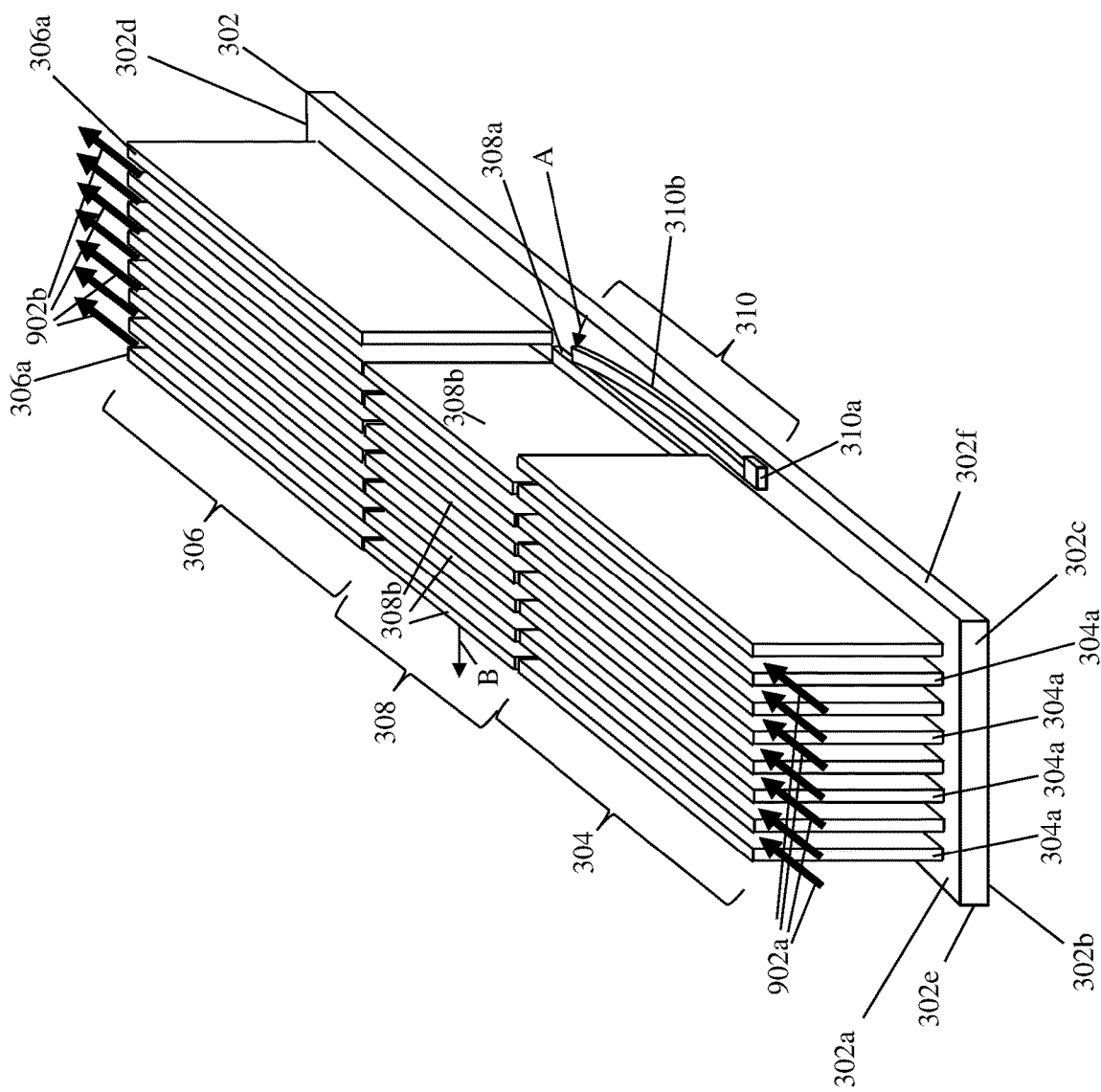
FIG. 9B is a top view illustrating an embodiment of the operation of the temperature-based heat sink airflow channel adjustment system of FIGS. 3A-3C during the method of FIG. 6.
Figure 9C:
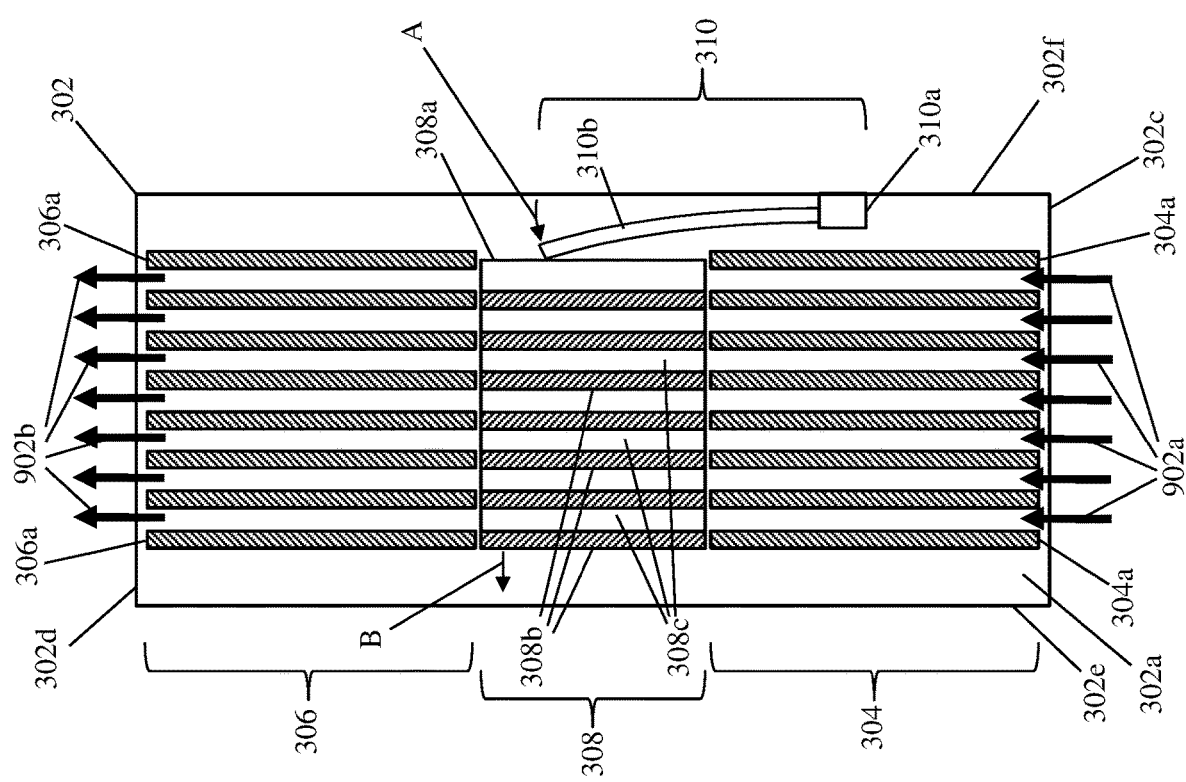
FIG. 9C is a front view illustrating an embodiment of the operation of the temperature-based heat sink airflow channel adjustment system of FIGS. 3A-3C during the method of FIG. 6.

In the embodiment illustrated in FIGS. 9A, 9B, and 9C, the moveable heat sink fin subsystem 308 is illustrated in a maximum airflow orientation in which the heat-activated actuator subsystem 310 (e.g., the heat-activated actuator element 310a) has moved (e.g., deformed) in the direction A a maximum amount to move the moveable heat sink fin subsystem 308 in the direction B a maximum amount (e.g., the heat sink base 302 has conducted heat to the heat-activated actuator subsystem 310 to change its temperature such that the heat-activated actuator element 310a moves/deforms in the direction A the maximum amount and causes the moveable heat sink fin subsystem 308 to move in the direction B the maximum amount to the maximum airflow orientation in which no portion of each of the seven heat sink fins 308b on the moveable heat sink fin subsystem 308 is positioned between a respective aligned pair of the volumes that provide the first fixed heat sink airflow sub-channel 304b and the second fixed heat sink airflow sub-channel 306b). In other words, the alignment of any pair of the volumes that provide the first fixed heat sink airflow sub-channel 304b and the second fixed heat sink airflow sub-channel 306b may be configured to allow air to flow through those volumes, and the maximum airflow orientation of the moveable heat sink fin subsystem 308 aligns each of the plurality of volumes that provide the moveable heat sink airflow subchannel 308c between respective pairs of volumes that provide the first fixed heat sink airflow sub-channel 304b and the second fixed heat sink airflow sub-channel 306b to allow the maximum flow of air through the first fixed heat sink airflow sub-channel 304b, the second fixed heat sink airflow sub-channel 306b, and the moveable heat sink airflow sub-channel 308c.

One of skill in the art in possession of the present disclosure will appreciate how the specific example of the maximum airflow orientation of the moveable heat sink fin subsystem 308 illustrated and described in FIGS. 9A-9C provides for an approximate doubling of the airflow through the pairs of the volumes that provide the first fixed heat sink airflow sub-channel 304b and the second fixed heat sink airflow sub-channel 306b relative to the reduced airflow orientation illustrated and described in FIGS. 3A-3C. However, while a specific maximum airflow orientation is illustrated and described, one of skill in the art in possession of the present disclosure will appreciate how other maximum airflow orientations (e.g., less than 100% the airflow through the pairs of the volumes that provide the first fixed heat sink airflow sub-channel 304b and the second fixed heat sink airflow sub-channel 306b) will fall within the scope of the present disclosure as well.

The method 600 then returns to block 604. As such, the networking module 700 will continue to generate heat as described above with reference to block 604, and the fan system in the networking device 200 will continue to generate an airflow as described above with reference to block 606 that will move through a heat sink airflow channel defined by the temperature-based heat sink airflow channel adjustment system 300 (e.g., integrated in or connected to the networking module 500, integrated in or connected to the networking module coupling chassis 400, etc.) via its first and second fixed heat sink fin subsystems 304 and 306 and its moveable heat sink fin subsystem 308.

With reference to FIGS. 9B and 9C, an embodiment of the airflow generated at block 606 is illustrated when the moveable heat sink fin subsystem 308 in the temperature-based heat sink airflow channel adjustment system 300 is provided in the maximum airflow orientation described above, and shows how a first airflow amount 902a of the portion of the airflow generated by the fan system in the networking device 200 may be provided at the first fixed heat sink fin subsystem 304, and a second airflow amount 902b that is substantially equal to the first airflow amount 802a (illustrated by the same "bolded" arrows 902a and 902b) may exit the second fixed heat sink fin subsystem 306. As discussed above, the maximum airflow orientation of the moveable heat sink fin subsystem 308 aligns each of the volumes that provide its moveable heat sink airflow sub-channel 308c between a respective aligned pair of the volumes that provide the first fixed heat sink airflow sub-channel 304b and the second fixed heat sink airflow sub-channel 306b in the first and second fixed heat sink fin subsystems 304 and 306 respectively, and operates to allow a maximum flow of air through any aligned pair of the volumes that provide the first fixed heat sink airflow sub-channel 304b, the moveable heat sink airflow sub-channel 308c, and the second fixed heat sink airflow sub-channel 306b.

As such, one of skill in the art in possession of the present disclosure will appreciate how substantially all of the first airflow amount 902a provided at the first fixed heat sink fin subsystem 304 may be allowed to flow through the heat sink airflow channel defined by the temperature-based heat sink airflow channel adjustment system 300 (e.g., defined by the first fixed heat sink airflow sub-channel 304b, the second fixed heat sink airflow sub-channel 306b, and the moveable heat sink airflow sub-channel 308c) such that a substantially equal second airflow amount 902b exits the second fixed heat sink fin subsystem 306. In an embodiment, the maximum airflow orientation of the moveable heat sink fin subsystem 308 may be configured to allow an amount of airflow through the heat sink airflow channel defined by the temperature-based heat sink airflow channel adjustment system 300 that is sufficient to allow the temperature-based heat sink airflow channel adjustment system 300 to provide a maximum amount of cooling required by the networking module 700 and/or allow a cooling airflow to reach components in the networking device 200 (e.g., that are adjacent to, or otherwise receive cooling airflow via, the temperature-based heat sink airflow channel adjustment system 300).

Furthermore, while a reduced airflow orientation of the moveable heat sink fin subsystem 308 that allows a minimum amount of airflow through the heat sink airflow channel defined by the temperature-based heat sink airflow channel adjustment system 300, as well as a maximum airflow orientation of the moveable heat sink fin subsystem 308 that allows a maximum amount of airflow through the heat sink airflow channel defined by the temperature-based heat sink airflow channel adjustment system 300, have been described, one of skill in the art in possession of the present disclosure will appreciate how the heat-activated actuator subsystem 310 may be activated (i.e., via heat conducted to the heat-activated actuator element 310c by the heat sink base 302) to move the moveable heat sink fin subsystem 308 into a plurality of intermediate airflow orientations between the reduced airflow orientation that allows the minimum amount of airflow through the heat sink airflow channel and the maximum airflow orientation that allows the maximum amount of airflow through the heat sink airflow channel.

As such, as the temperature of the heat-activated actuator subsystem 310 increases, the size of the heat sink airflow channel defined by the temperature-based heat sink airflow channel adjustment system 300 will increase from the reduced airflow orientation that allows the minimum amount of airflow through the heat sink airflow channel, through a plurality of intermediate airflow orientations that allow increasing amounts of airflow through the heat sink airflow channel, and up to the maximum airflow orientation that allows the maximum amount of airflow through the heat sink airflow channel. Furthermore, one of skill in the art in possession of the present disclosure will appreciate how, as the temperature of the heat-activated actuator subsystem 310 decreases, the size of the heat sink airflow channel defined by the temperature-based heat sink airflow channel adjustment system 300 will decrease from the maximum airflow orientation that allows the maximum amount of airflow through the heat sink airflow channel, through a plurality of intermediate airflow orientations that allow decreasing amounts of airflow through the heat sink airflow channel, and down to the reduced airflow orientation that allows the minimum amount of airflow through the heat sink airflow channel.

As will be appreciated by one of skill in the art in possession of the present disclosure, the use of a respective temperature-based heat sink airflow channel adjustment system 300 with each of the networking modules 700 illustrated in FIG. 7 provides the heat sink airflow channel size adjustments to each of those temperature-based heat sink airflow channel adjustment systems 300 as the power consumed and heat produced by their networking module changes, resulting in relatively lower power consumption/ lower heat producing networking modules utilizing relatively lower amount of the cooling airflow produced by the fan system in the networking device 200, and the relatively higher power consumption/higher heat producing networking modules utilizing relatively higher amount of the cooling airflow produced by the fan system in the networking device 200. Furthermore, as the power consumption/heat production of the networking modules changes, the amount of the cooling airflow utilized by those networking modules will change as well, resulting in a more efficient use of that cooling airflow, less power used to produce the cooling airflow needed to cool the networking modules, and/or other benefits that would be apparent to one of skill in the art in possession of the present disclosure.

Thus, systems and methods have been described that provide for the adjustment of a size of a heat sink airflow channel defined by a heat sink based on a temperature of the heat sink to reduce airflow through the heat sink at relatively lower temperatures, and increase airflow through the heat sink at relatively higher temperatures. For example, the networking module cooling system of the present disclosure may include a networking module connected to a networking device, and a temperature-based heat sink airflow channel adjustment system coupled to the networking module. The temperature-based heat sink airflow channel adjustment system includes a heat sink base, fixed heat sink fin subsystem(s) extending from the heat sink base and defining a first heat sink airflow sub-channel, and moveable heat sink fin subsystem(s) coupled to the heat sink base and defining a second heat sink airflow sub-channel adjacent the first heat sink airflow sub-channel. A heat-activated actuator subsystem coupled to the heat sink base is configured, in response to the heat sink base receiving heat generated by the networking module, to move the moveable heat sink fin subsystem(s) relative to the fixed heat sink fin subsystem(s) to adjust a size of a heat sink airflow channel provided by the first and second heat sink airflow sub-channels. As such, relatively higher temperature networking modules may utilize a larger portion of a cooling airflow from the networking device while relatively lower temperature networking modules utilize a smaller portion of that cooling airflow.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A networking module cooling system, comprising:
a networking device including a networking module connector;
a networking module that is connected to the networking module connector; and
a temperature-based heat sink airflow channel adjustment system that is coupled to the networking module and that includes:
a heat sink base that is configured to receive heat generated by the networking module;
at least one fixed heat sink fin subsystem that extends from the heat sink base and that defines a first heat sink airflow sub-channel;
at least one movable heat sink fin subsystem that is coupled to the heat sink base, that defines a second heat sink airflow sub-channel that is located adjacent the first heat sink airflow sub-channel, and that is configured to move relative to the at least one fixed heat sink fin subsystem to provide:
an unrestricted airflow orientation in which the first heat sink airflow sub-channel and the second heat sink airflow sub-channel are aligned to provide a heat sink airflow channel having a maximum size; and
at least one restricted airflow orientation in which the first heat sink airflow sub-channel and the second heat sink airflow sub-channel are misaligned to provide the heat sink airflow channel with a reduced size; and
a heat-activated actuator subsystem that is coupled to the heat sink base and that is configured, in response to the heat sink base receiving heat generated by the networking module, to move the at least one moveable heat sink fin subsystem relative to the at least one fixed heat sink fin subsystem to provide the heat sink airflow channel.

2. The system of claim 1, wherein the temperature-based heat sink airflow channel adjustment system is coupled to the networking module via a networking module coupling chassis.

3. The system of claim 1, wherein the temperature-based heat sink airflow channel adjustment system directly engages the networking module.

4. The system of claim 1, wherein the heat-activated actuator subsystem includes a bimetallic element that is configured, in response to the heat sink base receiving heat generated by the networking module and conducting that heat to the bimetallic element, to deform and move the at least one moveable heat sink fin subsystem relative to the at least one fixed heat sink fin subsystem.

5. The system of claim 1, wherein the at least one fixed heat sink fin subsystem includes a pair of spaced apart fixed heat sink fin subsystems, and wherein the at least one movable heat sink fin subsystem is located between the pair of spaced apart fixed heat sink fin subsystems.

6. The system of claim 1, wherein the networking module is one of a Small Form-factor Pluggable (SFP) transceiver module, an Octal Small Form-factor Pluggable (OSFP) transceiver module, or a Quad Small Form-factor Pluggable (QSFP) transceiver module.

7. The system of claim 1, further comprising:
a fan system that is included in the networking device and that is configured to generate an airflow through the heat sink airflow channel.

8. A temperature-based heat sink airflow channel adjustment system, comprising:
- a heat sink base that is configured to receive heat generated by a networking module when the heat sink base is coupled to the networking module;
- at least one fixed heat sink fin subsystem that extends from the heat sink base and that defines a first heat sink airflow sub-channel;
- at least one movable heat sink fin subsystem that is coupled to the heat sink base, that defines a second heat sink airflow sub-channel that is located adjacent the first heat sink airflow sub-channel, and that is configured to move relative to the at least one fixed heat sink fin subsystem to provide:
  - an unrestricted airflow orientation in which the first heat sink airflow sub-channel and the second heat sink airflow sub-channel are aligned to provide a heat sink airflow channel having a maximum size; and
  - at least one restricted airflow orientation in which the first heat sink airflow sub-channel and the second heat sink airflow sub-channel are misaligned to provide the heat sink airflow channel with a reduced size; and
- a heat-activated actuator subsystem that is coupled to the heat sink base and that is configured, in response to the heat sink base receiving heat generated by a networking module when the heat sink base is coupled to the networking module, to move the at least one moveable heat sink fin subsystem relative to the at least one fixed heat sink fin subsystem to provide the heat sink airflow channel.

9. The system of claim 8, wherein the heat sink base is configured to couple to a networking module via a networking module coupling chassis.

10. The system of claim 8, wherein the heat sink base is configured to couple to a networking module by directly engaging the networking module.

11. The system of claim 8, wherein the heat-activated actuator subsystem includes a bimetallic element that is configured, in response to the heat sink base receiving heat generated by a networking module when the heat sink base is coupled to the networking module and conducting that heat to the bimetallic element, to deform and move the at least one moveable heat sink fin subsystem relative to the at least one fixed heat sink fin subsystem.

12. The system of claim 8, wherein the at least one fixed heat sink fin subsystem includes a pair of spaced apart fixed heat sink fin subsystems, and wherein the at least one movable heat sink fin subsystem is located between the pair of spaced apart fixed heat sink fin subsystems.

13. The system of claim 8, wherein the heat sink base is configured to couple to a networking module provided by one of a Small Form-factor Pluggable (SFP) transceiver module, an Octal Small Form-factor Pluggable (OSFP) transceiver module, or a Quad Small Form-factor Pluggable (QSFP) transceiver module.

14. A method for adjusting heat sink airflow channels based on temperature, comprising:
- receiving, by a heat sink base that includes 1) at least one fixed heat sink fin subsystem that extends from the heat sink base and that defines a first heat sink airflow sub-channel and 2) at least one movable heat sink fin subsystem that is coupled to the heat sink base and that defines a second heat sink airflow sub-channel that is located adjacent the first heat sink airflow sub-channel, heat generated by a networking module that is coupled to the heat sink base;
- conducting, by the heat sink base, the heat to a heat-activated actuator subsystem that is coupled to the heat sink base; and
- moving, by the heat-activated actuator subsystem in response to receiving the heat conducted by the heat sink base, the at least one movable heat sink fin subsystem relative to the at least one fixed heat sink fin subsystem to adjust a size of a heat sink airflow channel provided by the first heat sink airflow sub-channel and the second heat sink airflow sub-channel, wherein the at least one moveable heat sink fin subsystem and the at least one fixed heat sink fin subsystem are moveable between:
  - an unrestricted airflow orientation in which the first heat sink airflow sub-channel and the second heat sink airflow sub-channel are aligned to provide a maximum size of the heat sink airflow channel; and
  - at least one restricted airflow orientation in which the first heat sink airflow sub-channel and the second heat sink airflow sub-channel are misaligned to reduce a size of the heat sink airflow channel from the maximum size.

15. The method of claim 14, wherein the heat sink base is coupled to the networking module via a networking module coupling chassis.

16. The method of claim 14, wherein the heat sink base directly engages the networking module.

17. The method of claim 14, wherein the heat-activated actuator subsystem includes a bimetallic element that, in response to receiving the heat conducted by the heat sink base, deforms and moves the at least one moveable heat sink fin subsystem relative to the at least one fixed heat sink fin subsystem.

18. The method of claim 14, wherein the at least one fixed heat sink fin subsystem includes a pair of spaced apart fixed heat sink fin subsystems, and wherein the at least one movable heat sink fin subsystem is located between the pair of spaced apart fixed heat sink fin subsystems.

19. The method of claim 14, wherein the networking module is one of a Small Form-factor Pluggable (SFP) transceiver module, an Octal Small Form-factor Pluggable (OSFP) transceiver module, or a Quad Small Form-factor Pluggable (QSFP) transceiver module.

20. The method of claim 14, further comprising:
- generating, by a fan system that is included in a networking device to which the networking module is connected, an airflow through the heat sink airflow channel.

* * * * *